United States Patent
Shin et al.

(10) Patent No.: US 9,472,568 B2
(45) Date of Patent: Oct. 18, 2016

(54) SEMICONDUCTOR DEVICE AND METHOD OF FABRICATING THE SAME

(71) Applicant: SAMSUNG ELECTRONICS CO., LTD., Suwon-si, Gyeonggi-do (KR)

(72) Inventors: Yoocheol Shin, Gyeonggi-do (KR); Jaegoo Lee, Gyeonggi-do (KR); Young-Jin Kwon, Gyeonggi-do (KR); Jintaek Park, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/502,115

(22) Filed: Sep. 30, 2014

(65) Prior Publication Data

US 2015/0102346 A1 Apr. 16, 2015

(30) Foreign Application Priority Data

Oct. 10, 2013 (KR) .................. 10-2013-0120720

(51) Int. Cl.
*H01L 27/115* (2006.01)
*H01L 21/768* (2006.01)

(52) U.S. Cl.
CPC ...... *H01L 27/11582* (2013.01); *H01L 21/76802* (2013.01); *H01L 27/1157* (2013.01); *H01L 27/11575* (2013.01)

(58) Field of Classification Search
CPC .................. H01L 27/11573; H01L 27/11273
USPC ........................................................ 257/302
See application file for complete search history.

(56) References Cited

U.S. PATENT DOCUMENTS

| 5,308,778 | A | * | 5/1994 | Fitch | H01L 21/8221 257/E21.41 |
|---|---|---|---|---|---|
| 7,910,432 | B2 | * | 3/2011 | Tanaka | H01L 27/11578 257/324 |
| 7,982,261 | B2 | * | 7/2011 | Kidoh | H01L 27/0688 257/314 |
| 8,017,993 | B2 | * | 9/2011 | Kidoh | H01L 27/11578 257/316 |
| 8,115,245 | B2 | * | 2/2012 | Yoshimizu | H01L 27/11578 257/315 |
| 8,194,467 | B2 | * | 6/2012 | Mikajiri | G11C 5/02 257/324 |
| 8,288,816 | B2 | * | 10/2012 | Komori | H01L 29/792 257/324 |
| 8,324,680 | B2 | * | 12/2012 | Izumi | H01L 27/115 257/324 |

(Continued)

FOREIGN PATENT DOCUMENTS

KR 1020130019688 2/2013

*Primary Examiner* — Earl Taylor
(74) *Attorney, Agent, or Firm* — F. Chau & Associates, LLC

(57) ABSTRACT

A semiconductor device is provided as follows. A peripheral circuit structure is disposed on a first substrate. A cell array structure is disposed on the peripheral circuit structure. A second substrate is interposed between the peripheral circuit structure and the cell array structure. The cell array structure includes a stacked structure, a through hole and a vertical semiconductor pattern. The stacked structure includes gate electrodes stacked on the second substrate. The through hole penetrates the stacked structure and the second substrate to expose the peripheral circuit structure. The vertical semiconductor pattern is disposed on the peripheral circuit structure, filling the through hole.

20 Claims, 20 Drawing Sheets

(56) References Cited

U.S. PATENT DOCUMENTS

| | | | | |
|---|---|---|---|---|
| 8,338,882 B2* | 12/2012 | Tanaka | | H01L 27/11578 257/324 |
| 8,374,033 B2* | 2/2013 | Kito | | G11C 16/0483 365/185.05 |
| 8,531,901 B2* | 9/2013 | Ogiwara | | G11C 16/30 365/185.17 |
| 9,059,395 B2* | 6/2015 | Ju | | H01L 45/08 |
| 2010/0320526 A1* | 12/2010 | Kidoh | | H01L 23/522 257/324 |
| 2011/0169071 A1* | 7/2011 | Uenaka | | H01L 27/105 257/326 |
| 2011/0233648 A1* | 9/2011 | Seol | | H01L 21/32137 257/324 |
| 2013/0239083 A1* | 9/2013 | Ueno | | G06F 17/5081 716/136 |
| 2014/0070302 A1* | 3/2014 | Yoo | | H01L 27/1157 257/324 |
| 2014/0284674 A1* | 9/2014 | Iwai | | H01L 27/1157 257/298 |
| 2015/0102346 A1* | 4/2015 | Shin | | H01L 27/1157 257/66 |
| 2015/0162342 A1* | 6/2015 | Lee | | H01L 27/11582 257/324 |
| 2015/0162343 A1* | 6/2015 | Park | | H01L 27/11582 257/329 |
| 2015/0263011 A1* | 9/2015 | Hong | | H01L 27/11573 257/329 |
| 2015/0294977 A1* | 10/2015 | Kim | | H01L 27/11573 257/314 |

* cited by examiner

SEMICONDUCTOR DEVICE AND METHOD OF FABRICATING THE SAME

CROSS-REFERENCE TO RELATED APPLICATION

This application claims priority under 35 U.S.C. §119 to Korean Patent Application No. 10-2013-0120720, filed on Oct. 10, 2013 in the Korean Intellectual Property Office, the disclosure of which is incorporated by reference herein in its entirety.

TECHNICAL FIELD

The present inventive concept relates to a semiconductor device and a method of fabricating the same.

DISCUSSION OF RELATED ART

The continued development of highly integrated semiconductor devices is spurred in part by consumer demand for low-cost, superior performance products. Indeed, particularly in the case of semiconductor devices, increased device integration is a major factor in achieving such low-cost products. Conventionally, semiconductor memory devices include planar or two-dimensional (2D) memory cell arrays, i.e., memory cell arrays having memory cells laid-out in a two-dimensional plane. Further integration of such devices is becoming more difficult (and costly) as patterning technologies approach practical limits. At the very least, expensive process equipments would be needed to achieve major advances in 2D memory cell array device integration.

As a result, three-dimensional (3D) semiconductor memory devices have been proposed in which the memory cells of the memory cell array are arranged in three dimensions. However, there are significant manufacturing obstacles in achieving low-cost, mass-production of 3D semiconductor memory devices, particularly in the mass-fabrication of 3D devices that maintain or exceed the operational reliability of their 2D counterparts.

SUMMARY

According to an exemplary embodiment of the inventive concept, a semiconductor device is provided as follows. A peripheral circuit structure is disposed on a first substrate. A cell array structure is disposed on the peripheral circuit structure. A second substrate is interposed between the peripheral circuit structure and the cell array structure. The cell array structure includes a stacked structure, a through hole and a vertical semiconductor pattern. The stacked structure includes a plurality of gate electrodes stacked on the second substrate. The through hole penetrates the stacked structure and the second substrate to expose the peripheral circuit structure. The vertical semiconductor pattern is disposed on the peripheral circuit structure, filling the through hole.

According to an exemplary embodiment of the inventive concept, a method of fabricating a semiconductor device is provided as follows. A peripheral circuit structure is formed on a first substrate. The peripheral circuit structure includes a peripheral transistor disposed on the first substrate and an interlayered insulating layer covering the peripheral transistor. A second substrate is formed on the peripheral circuit structure. The second substrate is formed of polysilicon. Insulating layers and sacrificial layers alternately and repeatedly are stacked on the second substrate to form a layered structure. A through hole is formed penetrating the layered structure and the second substrate and exposing the peripheral circuit structure. A semiconductor pattern is formed in a lower region of the through hole to be in contact with the peripheral circuit structure. According to an exemplary embodiment of the inventive concept, a semiconductor device is provided as follows. A peripheral circuit structure is disposed on a first substrate. The peripheral circuit structure includes a transistor. A gate pattern of the transistor is disposed on the first substrate and a source/drain region of the transistor is formed in the first substrate. A second substrate is disposed on the peripheral circuit structure. The second substrate includes a common source region. A vertical semiconductor pattern includes a lower semiconductor pattern and an upper semiconductor pattern. The lower semiconductor pattern penetrates the second substrate. A bottom surface of the lower semiconductor pattern is in contact with the peripheral circuit structure and a sidewall of the lower semiconductor pattern is in contact with the second substrate. The upper semiconductor pattern is stacked on the lower semiconductor pattern. A plurality of gate electrodes are disposed on a sidewall of the vertical semiconductor pattern. An electrode separation pattern is disposed on the common source region of the second substrate. The plurality of gate electrodes is interposed between the electrode separation pattern and the vertical semiconductor pattern. A vertical insulator is interposed between a sidewall of the vertical semiconductor pattern and at least one of the plurality of gate electrodes.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
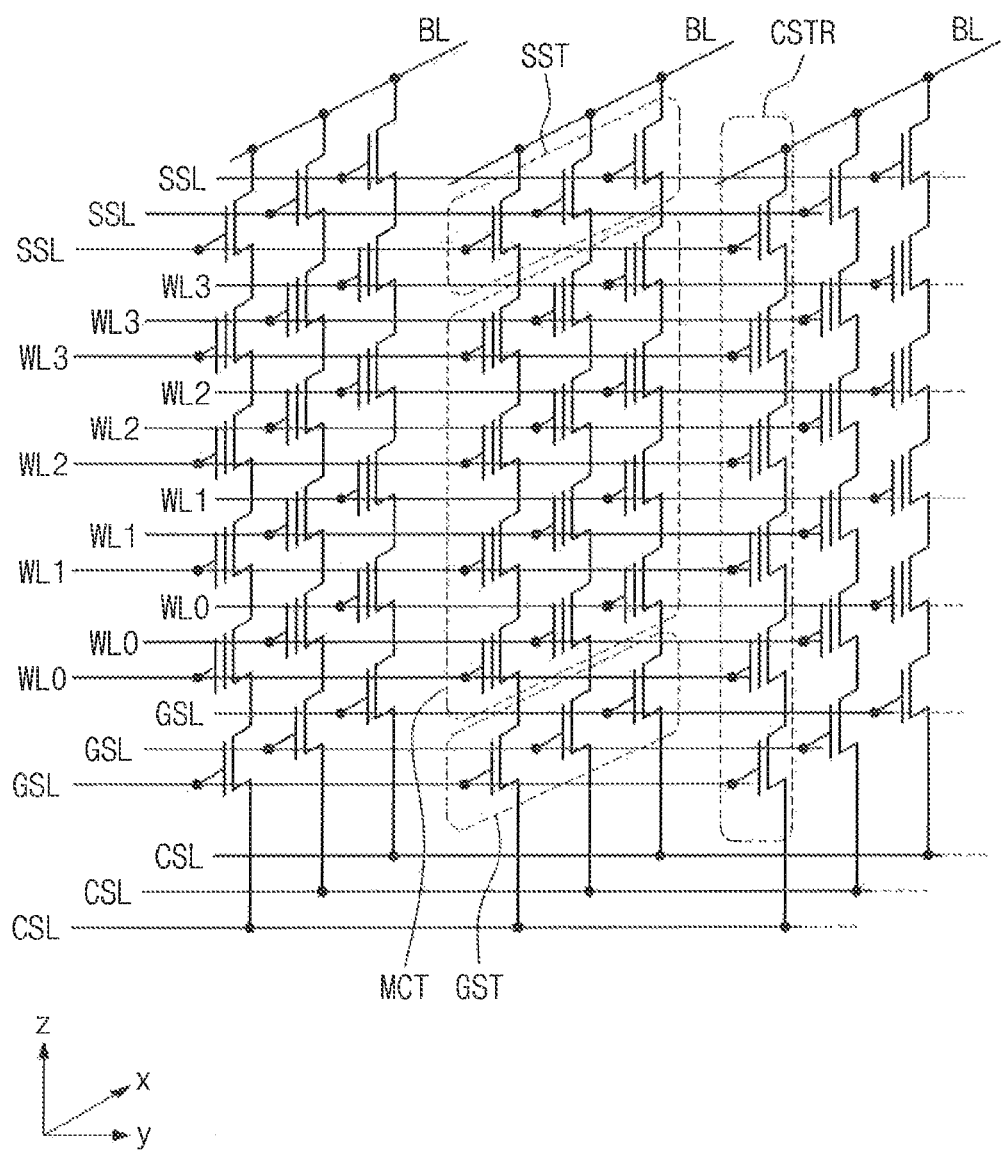
FIG. 1 is a circuit diagram illustrating a cell array of a 3D semiconductor memory device according to an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a circuit diagram illustrating a cell array of a 3D semiconductor memory device according to an exemplary embodiment of the inventive concept.

Referring to FIG. 1, a cell array of a 3D semiconductor memory device may include a common source line CSL, bit lines BL, and cell strings CSTR disposed between the common source line CSL and the bit lines BL.

The common source line CSL may be a conductive thin-film disposed on a substrate or an impurity region formed in the substrate. The bit lines BL may be conductive patterns (for example, metal lines) spaced apart from the substrate and disposed over the substrate. The bit lines BL may be two-dimensionally arranged and cell strings CSTR may be connected in parallel to each of the bit lines BL. The cell strings CSTR may be connected in common to the common source line CSL. For example, the cell strings CSTR may be disposed between the bit lines BL and the common source line CSL. Common source lines CSL may be disposed and be two-dimensionally arranged on the substrate. The common source lines CSL may be applied with the same voltage. Alternatively, the common source lines CSL may be separated from each other and thus may be independently controlled.

Each of the cell strings CSTR nay include a ground selection transistor GST coupled to the common source line CSL, a string selection transistor SST coupled to the bit line BL, and memory cell transistors MCT disposed between the ground and string selection transistors GST and SST. Further, the ground selection transistor GST, the string selection transistor SST, and the memory cell transistors MCT may be connected in series to each other.

The common source line CSL may be connected in common to source regions of the ground selection transistors GST. Furthermore, a ground selection line GSL, word lines WL0-WL3, and string selection lines SSL, which are disposed between the common source line CSL and the bit lines BL, may serve as gate electrodes of the ground selection transistor GST, the memory cell transistors MCT and the string selection transistors SST. In addition, each of the memory cell transistors MCT may include a data storage element.

Figure 2:
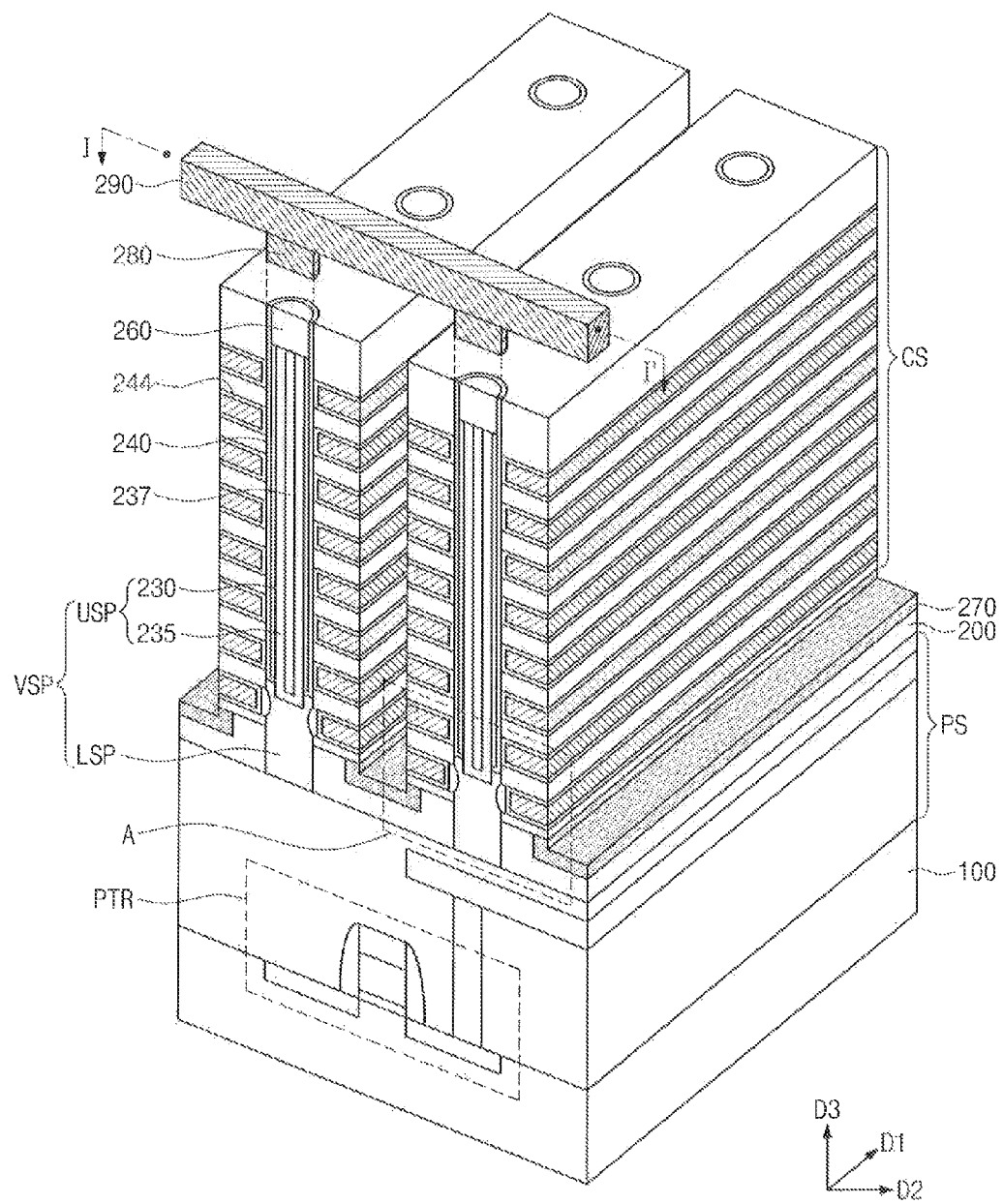
FIG. 2 is a perspective view illustrating a 3D semiconductor memory device according to an exemplary embodiment of the inventive concept.
Figure 3:
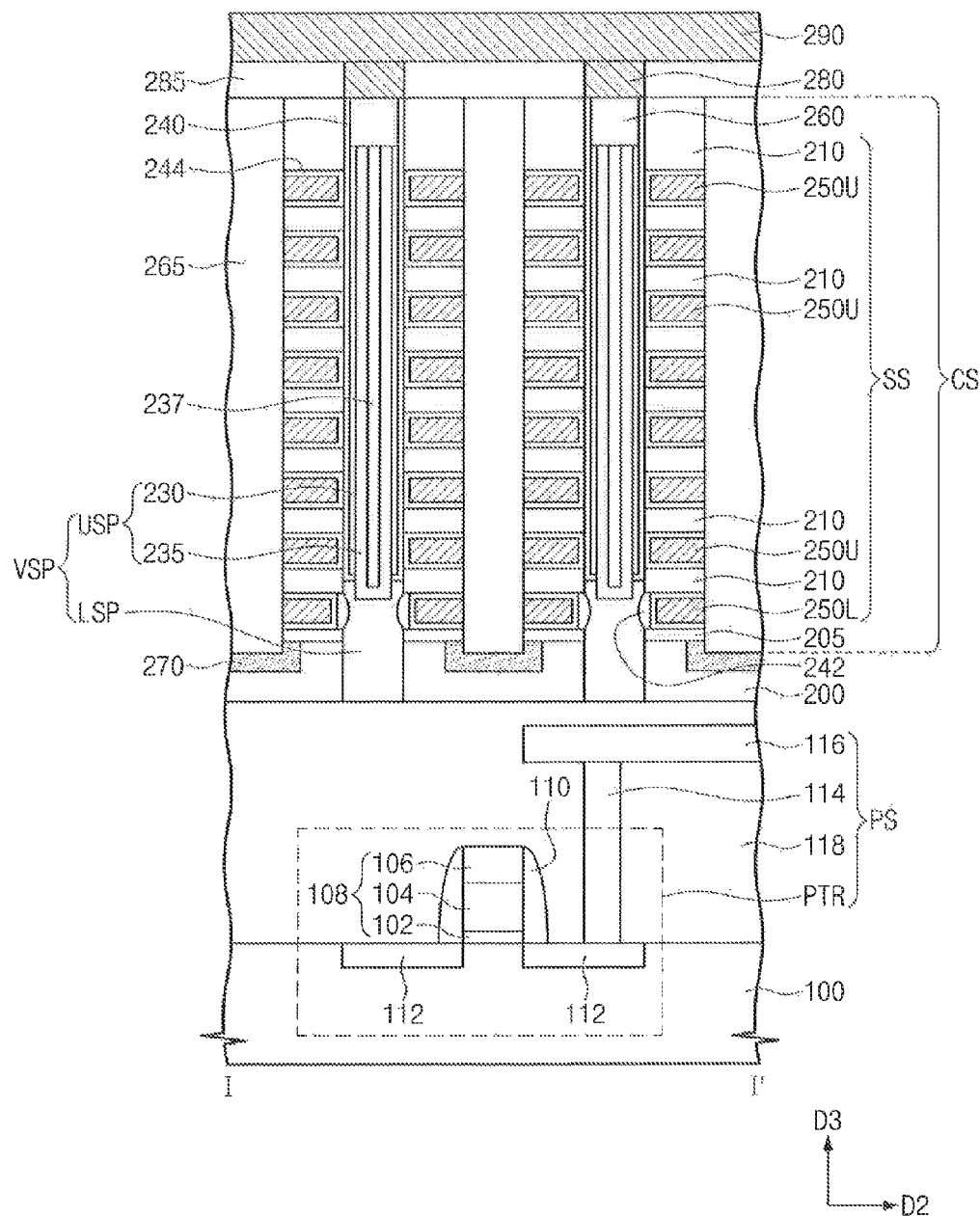
FIG. 3 is a sectional view taken along a line I-I' of FIG. 2 to illustrate the 3D semiconductor memory device according to an exemplary embodiment of the inventive concept.
Figure 4:
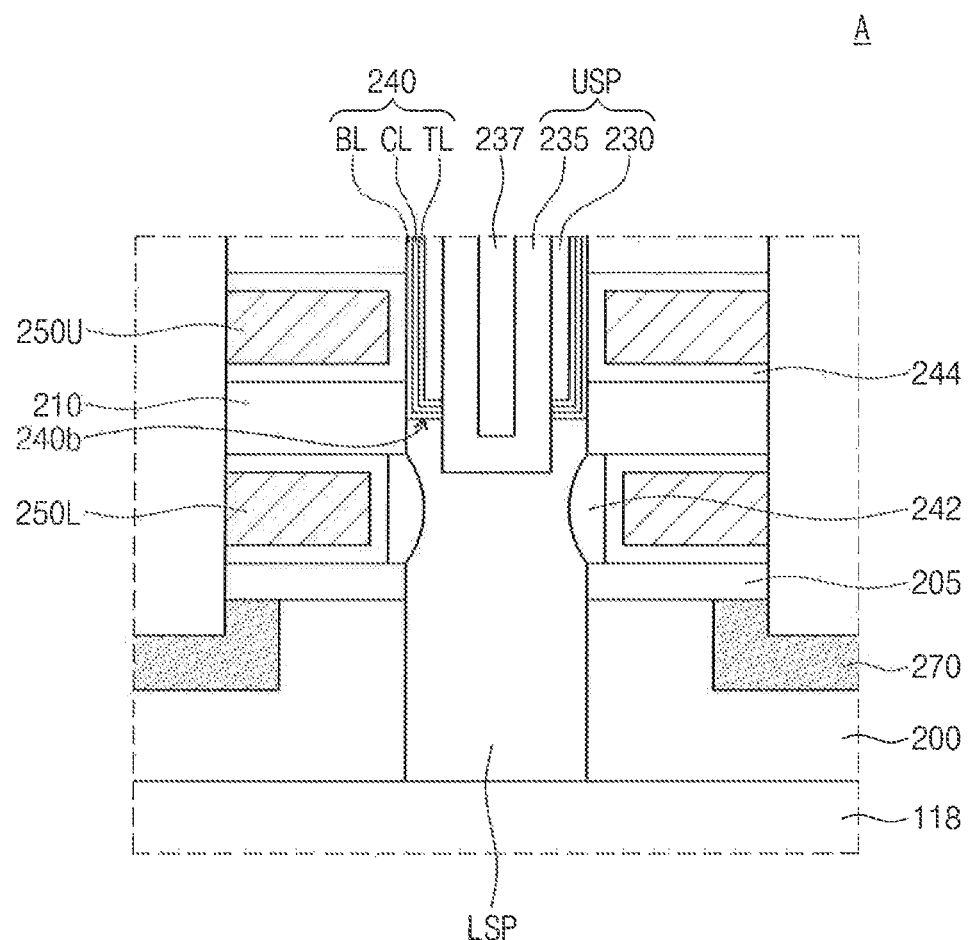
FIG. 4 is an enlarged sectional view of portion A of FIG. 2.

FIG. 2 is a perspective view illustrating a 3D semiconductor memory device according to an exemplary embodiment of the inventive concept. FIG. 3 is a sectional view taken along line I-I' of FIG. 2 to illustrate the 3D semiconductor memory device according to an exemplary embodiment of the inventive concept, and FIG. 4 is an enlarged sectional view of portion A of FIG. 2.

Referring to FIGS. 2 and 3, a 3D semiconductor memory device may include a peripheral circuit structure PS disposed on a first substrate 100, a cell array structure CS disposed on the peripheral circuit structure PS, and a second substrate 200 disposed between the peripheral circuit structure PS and the cell array structure CS.

The first substrate 100 may be, for example, a silicon wafer, a germanium wafer or a silicon-germanium wafer.

The peripheral circuit structure PS may include a peripheral transistor PTR on the first substrate 100, a peripheral contact plug 114 connected to the peripheral transistor PTR, and a conductive line 116 connected to the peripheral contact plug 114.

The peripheral transistor PTR may include a peripheral gate pattern 108 disposed on the first substrate 100, a gate spacer 110 disposed on both sidewalls of the peripheral gate pattern 108, and source/drain regions 112, which may be formed in the first substrate 100 at both sides of the peripheral gate pattern 108. The peripheral gate pattern 108 may include a peripheral gate dielectric pattern 102, a peripheral gate electrode 104, and a peripheral capping pattern 106 sequentially stacked on the first substrate 100. The peripheral transistor PTR may be electrically connected to at least one of the bit lines BL, the word lines WL0-WL3, the common source lines CSL, the ground selection lines GSL, and the string selection lines SSL described with reference to FIG. 1 and be used to control an operation thereof.

The peripheral circuit structure PS may further include a first interlayered insulating layer 118 covering the peripheral transistor PTR, the peripheral contact plug 114, and the conductive line 116. The first interlayered insulating layer 118 may include an oxide layer, a nitride layer, and/or an oxynitride layer.

The second substrate 200 may be disposed on the first interlayered insulating layer 118. The second substrate 200 may include a semiconductor layer having a single- or poly-crystalline structure. For example, the second substrate 200 may include a polysilicon layer. The second substrate 200 may include common source regions 270 doped with impurities. The common source regions 270 may have a line shape extending along a first direction D1 and be arranged along a second direction D2 crossing the first direction D1.

The cell array structure CS may be disposed on the second substrate 200. The cell array structure CS may include a stacked structure SS including insulating layers 210 and gate electrodes, which are alternately and repeatedly stacked on the second substrate 200. The gate electrodes may include a lowermost gate electrode 250L on the second substrate 200 and upper gate electrodes 250U stacked on the lowermost gate electrode 250L.

When viewed in a plan view, the stacked structure SS may have a line shape extending along the first direction D1. The common source regions 270 may be disposed at both sides of the stacked structure SS. A lowermost insulating layer 205 may be disposed between the second substrate 200 and the stacked structure SS. The lowermost insulating layer 205 may be, for example, a silicon oxide layer. The lowermost insulating layer 205 may have a thickness smaller than that of the insulating layers 210.

The cell array structure CS may further include vertical semiconductor patterns VSP, which may penetrate the stacked structure SS and be electrically connected to the second substrate 200. The vertical semiconductor patterns VSP may penetrate the stacked structure SS and the second substrate 200 and be in contact with a top surface of the first interlayered insulating layer 118. When viewed in a plan view, the vertical semiconductor patterns VSP may be arranged along the first direction D1, as shown in FIG. 2. Alternatively, when viewed in a plan view, the vertical semiconductor patterns VSP may be arranged to have a zigzag arrangement in the first direction D1.

Each of the vertical semiconductor patterns VSP may include a lower semiconductor pattern ISP and an upper semiconductor pattern USP. The lower semiconductor pattern LSP may penetrate a lower portion of the stacked structure SS and the second substrate 200 and be in contact with a top surface of the first interlayered insulating layer 118, and the upper semiconductor pattern USP may be formed through an upper portion of the stacked structure SS and be connected to the lower semiconductor pattern LSP.

The upper semiconductor pattern USP may have a pipe-shaped or macaroni-shaped structure. The upper semiconductor pattern USP may have a closed bottom. An inner space of the upper semiconductor pattern USP may be filled with an insulating gapfill pattern 237. The upper semiconductor pattern USP may have a bottom surface located at a lower level than a top surface of the lower semiconductor pattern LSP. For example, the bottom surface of the upper semiconductor pattern USP may be inserted into the lower semiconductor pattern LSP.

The upper semiconductor pattern USP may include a first semiconductor pattern 230 and a second semiconductor pattern 235. The first semiconductor pattern 230 may cover an inner surface of the stacked structure SS. The first semiconductor pattern 230 may have a pipe-shaped or macaroni-shaped structure, whose top and bottom are open. The first semiconductor pattern 230 need not be in contact with the lower semiconductor pattern LSP or be spaced apart from the lower semiconductor pattern LSP. The second semiconductor pattern 235 may have a pipe-shaped or macaroni-shaped structure having a closed bottom. An inner space of the second semiconductor pattern 235 may be filled with the insulating gapfill pattern 237. The second semiconductor pattern 235 may be in contact with an inner surface of the first semiconductor pattern 230 and an upper portion of the lower semiconductor pattern LSP. The second semiconductor pattern 235 may have a bottom surface lower than the top surface of the lower semiconductor pattern LSP. For example, the second semiconductor pattern 235 may include a portion inserted into the lower semiconductor pattern LSP and electrically connect the first semiconductor pattern 230 to the lower semiconductor pattern LSP.

The first and second semiconductor patterns 230 and 235 may include a semiconductor material. For example, the first and second semiconductor patterns 230 and 235 may contain silicon (Si), germanium (Ge), or any mixture thereof and be a doped or intrinsic semiconductor layer. Further, the first and second semiconductor patterns 230 and 235 may have a single-crystalline, amorphous, or polycrystalline crystal structure.

The lower semiconductor pattern LSP may be formed of a semiconductor material having the same conductivity type as the second substrate 200. The lower semiconductor pattern LSP may epitaxially grown from the second substrate 200 which may be formed of a semiconductor material. The second substrate 200 may serve as a seed layer for the epitaxial growth of the lower semiconductor pattern LSP. In this case, at least a portion of the lower semiconductor pattern LSP may have a single- or poly-crystalline structure.

The lower semiconductor pattern LSP may be in contact with an inner surface of the second substrate 200 and a bottom surface of the lower semiconductor pattern LSP may be in contact with the first interlayered insulating layer 118. The lower semiconductor pattern LSP may be pillar-shaped, penetrating the second substrate 200.

The lower semiconductor pattern LSP may penetrate the second substrate 200 to be in contact with the inner surface of the second substrate 200. Further, the lower semiconductor pattern LSP may be in contact with the peripheral circuit structure PS. For example, the lower semiconductor pattern LSP may be epitaxially grown from the inner surface of the second substrate 200. The inner surface of the second substrate 200 may serve as a seed layer. Since the lower semiconductor pattern LSP is formed to penetrate the second substrate 200, it is possible to improve uniformity in thickness of the lower semiconductor pattern LSP or a distance between the bottom and top surfaces of the lower semiconductor pattern LSP. Accordingly, a 3D semiconductor memory device, in which the lower semiconductor pattern LSP is used as a channel region of the ground selection transistor GST, may improve uniformity in amount of cell current of the ground selection transistor GST.

The stacked structure SS will be described in more detail hereinafter. The stacked structure SS may include the lowermost gate electrode 250L adjacent to the lower semiconductor pattern LSP and the upper gate electrodes 250U adjacent to the upper semiconductor pattern USP. The lowermost gate electrode 250L and the upper gate electrodes 250U may be stacked along a third direction D3 perpendicular to both of the first and second directions D1 and D2. The gate electrodes 250U and 250L may be separated from each other by the insulating layers 210 disposed between the gate electrodes 250U and 250L.

The lowermost gate electrode 250L may serve as the gate electrode of the ground selection transistor GST described with reference to FIG. 1. For example, in 3D NAND FLASH memory devices, the lowermost gate electrode 250L may be used as the gate electrode of the ground selection transistor GST controlling electrical connection between the common source regions 270 formed in the second substrate 200 and the lower semiconductor pattern LSP. Some of the upper gate electrodes 250U may serve as the gate electrodes of the memory cell transistors MCT described with reference to FIG. 1. Further, the upper gate electrode 250U, which may be located at the uppermost level of the stacked structure SS, may serve as the gate electrode of the string selection transistor SST described with reference to FIG. 1. For example, in the 3D NAND FLASH memory devices, the upper gate electrode 250U which is located at the uppermost level of the stacked structure SS may serve as the gate electrode of the string selection transistor SST controlling electric connection between bit lines 290 and the vertical semiconductor patterns VSP.

At least one of the insulating layers 210 adjacent to the lower semiconductor pattern LSP may be in direct contact with a sidewall of the lower semiconductor pattern LSP. For example, a portion of the top surface of the lower semiconductor pattern LSP may be higher than that of the lowermost gate electrode 250L. A gate dielectric pattern 242 may be disposed between the lower semiconductor pattern LPS and the lowermost gate electrode 250L. The gate dielectric pattern 242 may include, for example, a silicon oxide layer. The gate dielectric pattern 242 may be formed by oxidizing a portion of the lower semiconductor pattern LSP.

A vertical insulator 240 may be interposed between the stacked structure SS and the upper semiconductor pattern USP. The vertical insulator 240 may be pipe-shaped or macaroni-shaped.

Referring to FIG. 4, a bottom surface 240b of the vertical insulator 240 may be in contact with at least a portion of the top surface of the lower semiconductor pattern LSP. In addition, the vertical insulator 240 may include a memory element for realizing FLASH memory devices. For example, the vertical insulator 240 may include a charge storing layer CL constituting a FLASH memory device. Data stored in the vertical insulator 240 may be changed using a Fowler-Nordheim (FN) tunneling effect, which may be caused by a difference in voltage between the upper semiconductor pattern USP and the upper gate electrodes 250U. Alternatively, the vertical insulator 240 may include a memory layer (e.g., of a phase-changeable or variable-resistance element) configured to store information using other operation principles.

The vertical insulator 240 may include the charge storing layer CL and a tunnel insulating layer TL that are sequentially stacked. The tunnel insulating layer TL may be in direct contact with the upper semiconductor pattern USP, and the charge storing layer CL may be interposed between the tunnel insulating layer TL and the upper gate electrodes 250U. Referring to FIG. 4, the vertical insulator 240 may further include a blocking insulating layer BL interposed between the charge storing layer CL and the upper gate electrodes 250U.

The charge storing layer CL may include at least one of for example, a silicon nitride layer, a silicon oxynitride layer, a silicon-rich nitride layer, a nanocrystalline silicon layer, and a laminated trap layer. The tunnel insulating layer TL may include a material having a band gap higher than that of the charge storage layer CL. For example, the tunnel insulating layer IL may be a silicon oxide layer. The blocking insulating layer BL may include a material having a band gap higher than that of the charge storing layer CL. The blocking insulating layer BL may be a silicon oxide layer, a silicon nitride layer, and/or a silicon oxynitride layer.

Although not shown, the vertical insulator 240 may include a capping layer (not shown) interposed between the upper semiconductor pattern USP and the insulating layers 210. The capping layer may be in direct contact with the insulating layers 210 and be vertically divided into segments by the upper gate electrodes 250U. The capping layer may be vertically extended and be disposed between the upper semiconductor pattern. USP and the upper gate electrodes 250U. The capping layer may include an insulator that has etch selectivity with respect to the charge storing layer CL and be different from the insulating layers 210. For example, the capping layer may be at least one of a silicon layer, a silicon oxide layer, a polysilicon layer, a silicon carbide layer, and a silicon nitride layer but may be selected to include a different material from the insulating layers 210. The capping layer may be a high-k dielectric (e.g., tantalum oxide ($Ta_2O_5$), titanium oxide ($TiO_2$), hafnium oxide ($HfO_2$), and/or zirconium oxide ($ZrO_2$).

Referring to FIGS. 2 and 3, horizontal insulators 244 may be disposed on top and bottom surfaces of the gate electrodes 250L and 250U. The horizontal insulators 244 may include a portion extending between the gate electrodes 250L and 250U and the vertical insulator 240 and another portion extending between the gate electrodes 250L and 250U and the gate dielectric pattern 242. The horizontal insulators 244 may be single layered or multi-layered. The horizontal insulators 244 may include a blocking insulating layer constituting memory cell transistors of a charge-trap type FLASH memory device.

In addition, a conductive pad 260 may penetrate the stacked structure SS and be connected to the upper semiconductor pattern USP. The conductive pad 260 may have a top surface, which may be substantially coplanar with that of the stacked structure SS, and a bottom surface, which may be in direct contact with the upper semiconductor pattern USP. The vertical insulator 240 may be disposed between the conductive pad 260 and the insulating layer 210 adjacent thereto. The conductive pad 260 may be a doped region or include a conductive material.

Electrode separation patterns 265 may be disposed at both sides of the stacked structure SS. The electrode separation patterns 265 may cover the common source regions 270. The cell array structure CS may further include the vertical insulator 240, the horizontal insulators 244, the conductive pad 260, and the electrode separation patterns 265.

The bit line 290 may be formed on the stacked structure SS to cross the stacked structure SS. The bit line 290 may be coupled to the conductive pad 260 via a contact plug 280 and be spaced apart from the stacked structure SS by a second interlayered insulating layer 285.

FIGS. 5 through 13 are sectional views taken along line I-I' of FIG. 2 to illustrate a method of fabricating a 3D semiconductor memory device according to an exemplary embodiment of the inventive concept.

Figure 5:
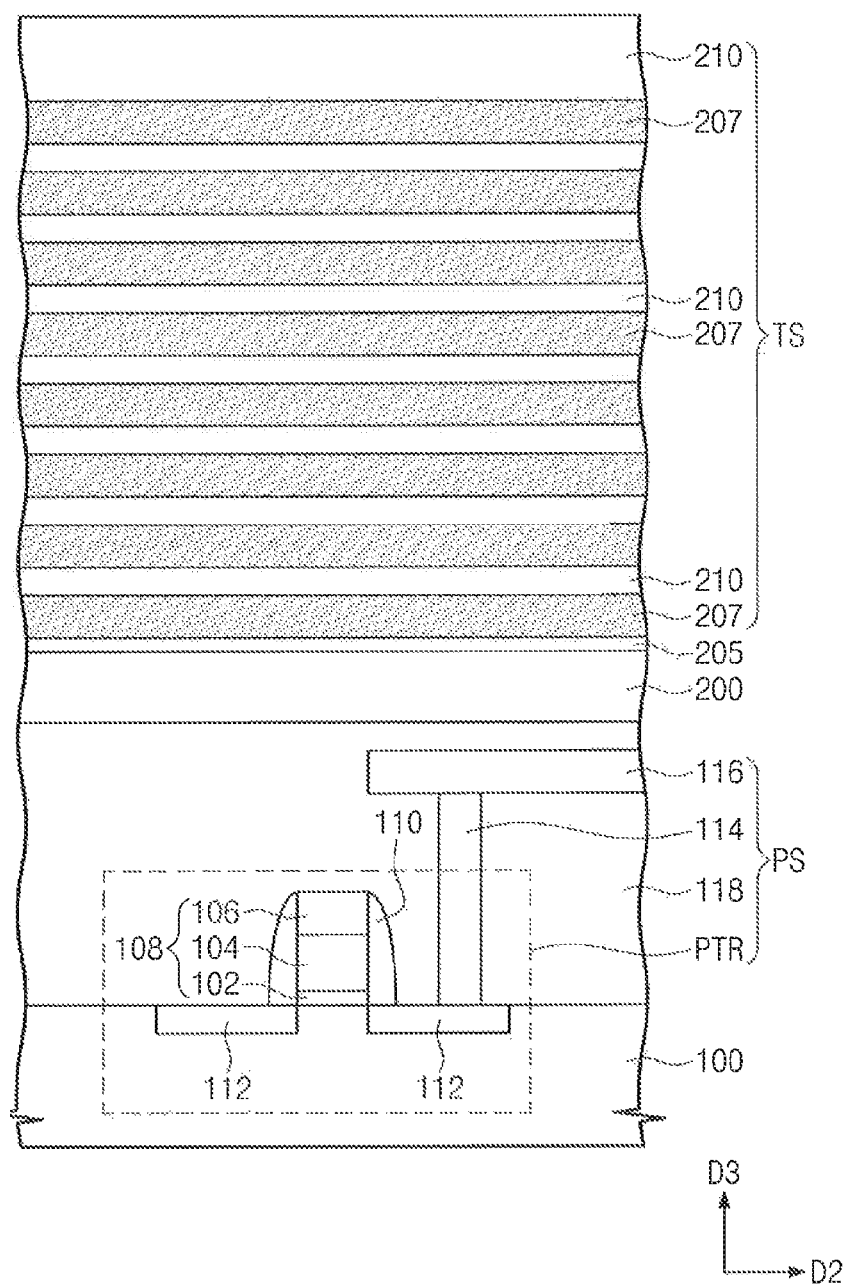
FIGS. 5 through 13 are sectional views taken along line I-I' of FIG. 2 to illustrate a method of fabricating a 3D semiconductor memory device according to an exemplary embodiment of the inventive concept.

Referring to FIG. 5, a peripheral gate pattern 108 may be formed on a first substrate 100. The formation of the peripheral gate pattern 108 may include sequentially stacking a peripheral gate dielectric, a peripheral gate electrode layer, and a peripheral capping layer on the first substrate 100, and then, patterning the peripheral capping layer, the peripheral gate electrode layer, and the peripheral gate dielectric to form a peripheral gate dielectric pattern 102, a peripheral gate electrode 104, and a peripheral capping pattern 106 sequentially stacked on the first substrate 100. Source/drain regions 112 may be formed in portions of the first substrate 100 disposed at both sides of the peripheral gate pattern 108. The formation of the source/drain regions 112 may include injecting impurities into the first substrate 100 disposed at both sides of the peripheral gate pattern 108. A gate spacer 110 may be disposed on both sidewalls of the peripheral gate pattern 108. The peripheral gate pattern 108, the gate spacer 110, and the source/drain regions 112 may constitute a peripheral transistor PTR. Thereafter, a conductive line 116 may be connected to the peripheral transistor PTR through a peripheral contact plug 114 interposed therebetween.

A first interlayered insulating layer 118 may be further formed on the first substrate 100 to cover the peripheral transistor PTR, the conductive line 116, and the peripheral contact plug 114. The first interlayered insulating layer 118 may be formed of an oxide layer, a nitride layer, and/or an oxynitride layer. The first interlayered insulating layer 118 may be formed by a deposition process (e.g., a chemical vapor deposition (CVD)). Thereafter, a planarization process may be performed such that the first interlayered insulating layer 118 may have a flat top surface.

The peripheral transistor PTR, the conductive line 116, the peripheral contact plug 114, and the first interlayered insulating layer 118 may constitute the peripheral circuit structure PS.

A second substrate 200 may be formed on the first interlayered insulating layer 118. The second substrate 200 may be formed of a semiconductor layer with a single- or poly-crystalline structure. For example, the second substrate 200 may be formed of a polysilicon layer. The second substrate 200 may be formed by, for example, a deposition process (e.g., CVD).

A lowermost insulating layer 205 may be formed on the second substrate 200. For example, the lowermost insulating layer 205 may be a silicon oxide layer formed using a thermal oxidation process. The lowermost insulating layer 205 may be a silicon oxide layer formed using a deposition process.

Sacrificial layers 207 and insulating layers 210 may be alternately and repeatedly deposited on the lowermost insulating layer 205 to form a layered structure TS.

The sacrificial layers 207 may be formed of a material, which may be etched with a sufficiently high etch selectivity with respect to the insulating layers 210. The etch selectivity between the sacrificial layers 207 and the insulating layers 210 may be high in a wet etching process, compared with the case of a dry etching process using an etching gas.

The sacrificial layers 207 may be formed to have substantially the same thickness. The uppermost and lowermost layers of the sacrificial layers 207 may be thicker than the others therebetween. The insulating layers 210 may have substantially the same thickness, but at least one of the insulating layers 210 may have a different thickness from the others. The lowermost insulating layer 205 may be thinner than the sacrificial layers 207 and the insulating layers 210 disposed thereon.

The sacrificial layers 207 and the insulating layers 210 may be deposited using, for example, a thermal CND process, a plasma-enhanced CND process, a physical CVD process, or an atomic layer deposition (ALD) process.

The sacrificial layers 207 and the insulating layers 210 may have etch selectivity with respect to each other. For example, the sacrificial layers 207 may be at least one of a silicon layer, a silicon oxide layer, a silicon carbide layer, a silicon oxynitride layer, and a silicon nitride layer. The insulating layers 210 may be at least one of a silicon layer, a silicon oxide layer, a silicon carbide layer, a silicon oxynitride layer, and a silicon nitride layer, but it may be a material selected to be different from the sacrificial layer 207. For example, the sacrificial layers 207 may be formed of a silicon nitride layer, while the insulating layers 210 may be formed of a silicon oxide layer. The sacrificial layers 207 may be formed of a conductive material, and the insulating layers 210 may be formed of an insulating material.

Figure 6:
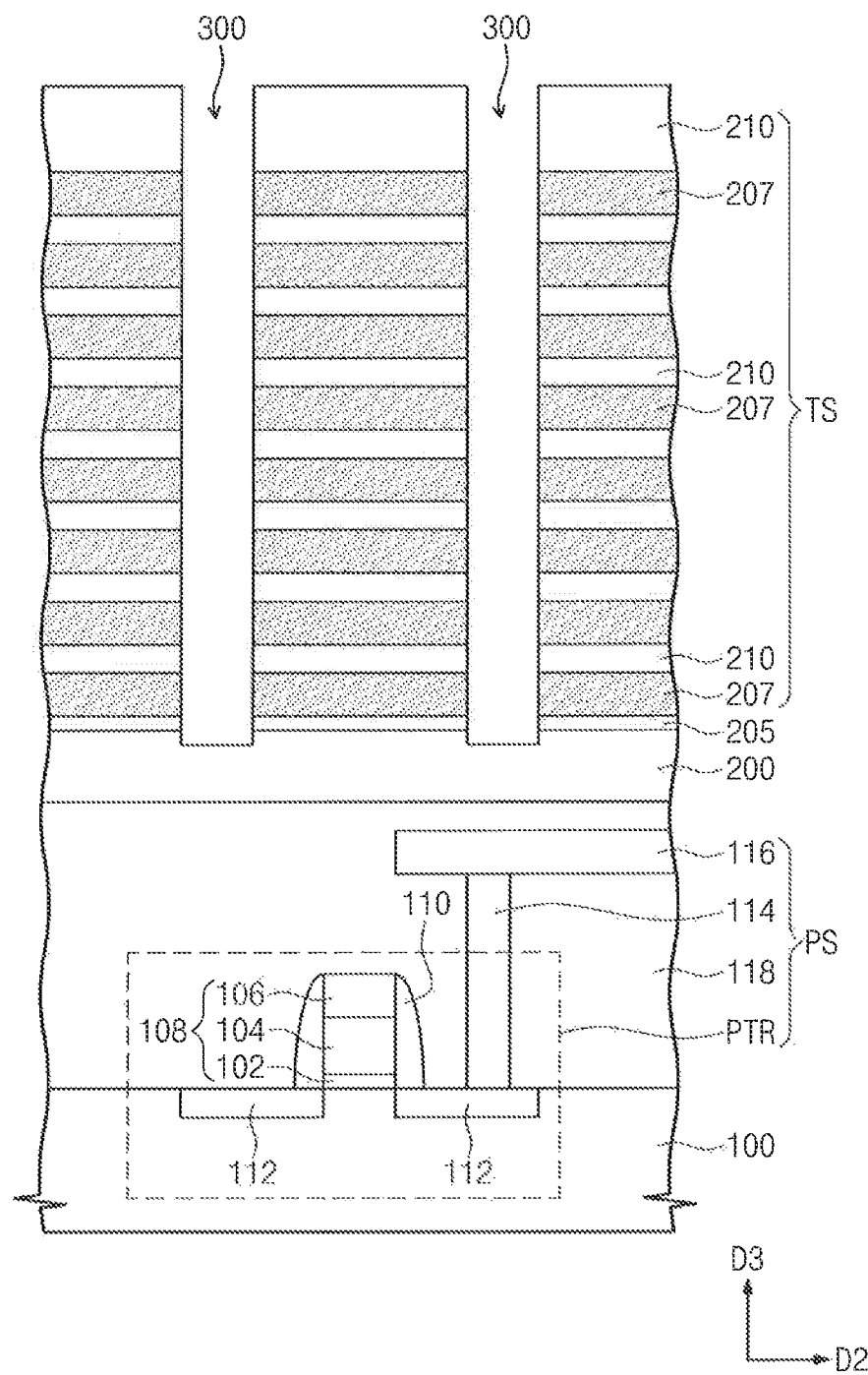

Referring to FIG. 6, preliminary through holes 300 may be formed. The preliminary through holes 300 penetrate the layered structure TS to expose the second substrate 200. As shown in FIG. 2, the preliminary through holes 300 may be two-dimensionally arranged on the top surface of the layered structure TS. The preliminary through holes 300 may be arranged along the first direction D1. Alternatively, the preliminary through holes 300 may be arranged in a zigzag order along the first direction D1.

The formation of the preliminary through holes 300 may include forming first mask patterns on the layered structure TS. The first mask patterns may have openings defining positions of the preliminary through holes 300 to be formed. The layered structure TS may be anisotropically etched using the first mask patterns as an etch mask. The first mask patterns may be formed of a material having an etch selectivity with respect to the sacrificial layers 207 and the insulating layers 210.

The etching of the layered structure TS may be performed using an etch recipe having etch selectivity with respect to the second substrate 200. Accordingly, the second substrate 200 may serve as an etch stop layer, during the etching process. During the etching process, the top surface of the second substrate 200 may be over-etched or partially recessed.

Figure 7:
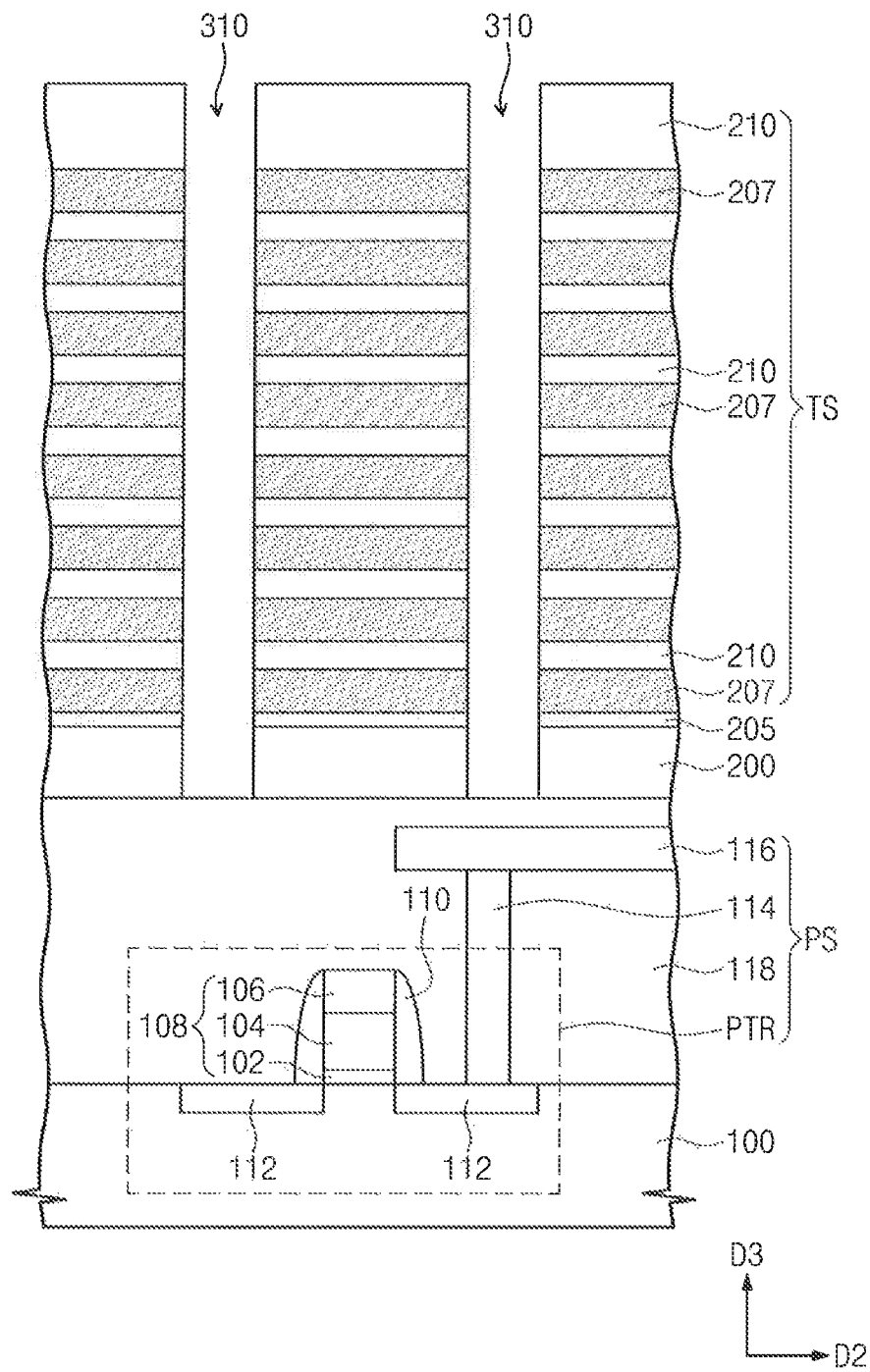

Referring to FIG. 7, the preliminary through holes 300 may be further etched to form through holes 310 penetrating the layered structure TS and the second substrate 200 and thereby exposing the top surface of the first interlayered insulating layer 118.

The formation of the through holes 310 may include etching anisotropically the second substrate 200 using the first mask patterns as an etch mask, after the formation of the preliminary through holes 300. The etching of the second substrate 200 may be performed using an etch recipe having etch selectivity with respect to the first interlayered insulating layer 118. As the result of the etching process, the top surface of the first interlayered insulating layer 118 may be exposed by the through holes 310. During the etching process, the top surface of the first interlayered insulating layer 118 may be over-etched and partially recessed. After the anisotropic etching process, a bottom width of the through hole 310 may be smaller than a top width thereof.

Figure 8:
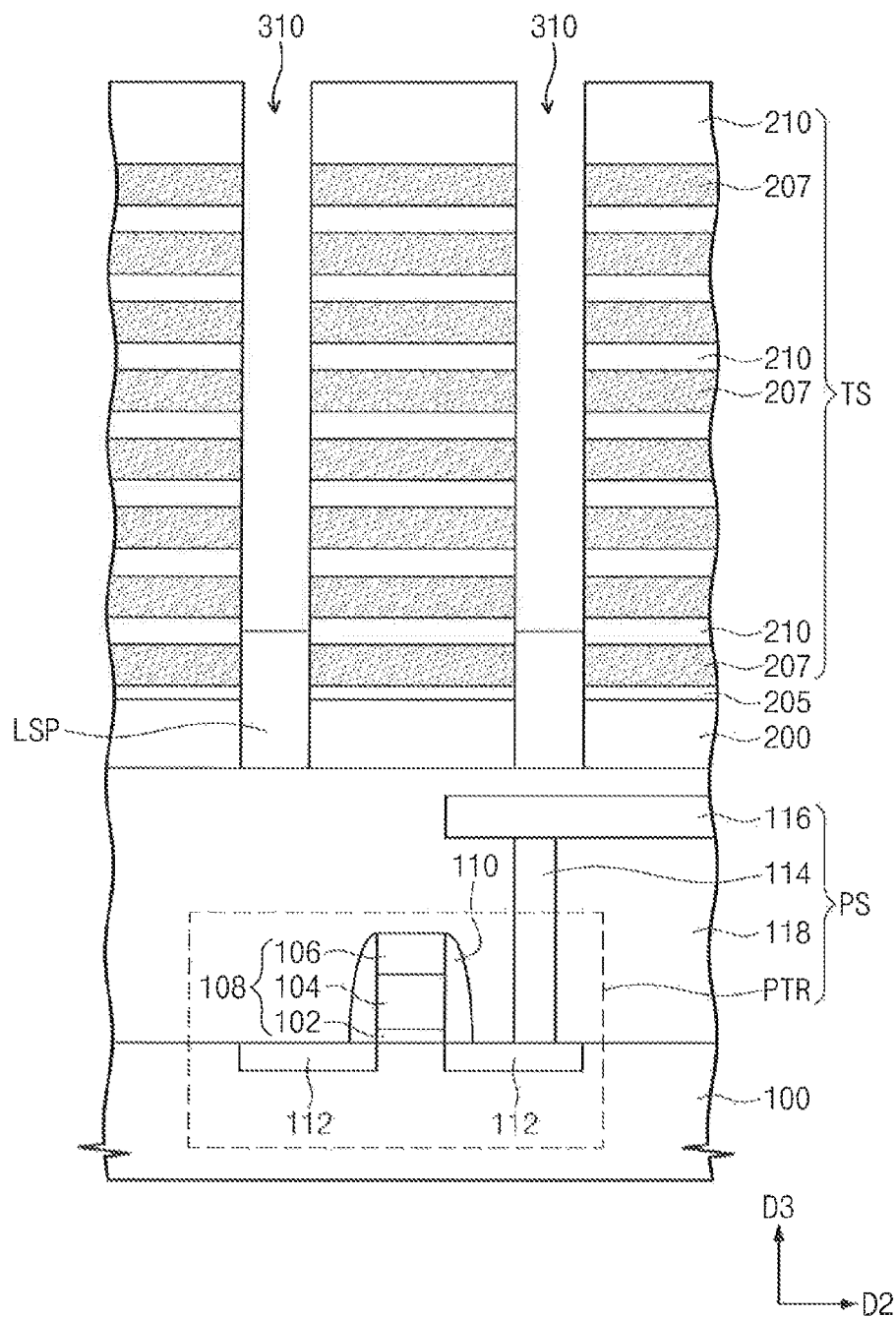

Referring to FIG. 8, lower semiconductor patterns LSP may be formed. The lower semiconductor patterns LSP may fill lower regions of the through holes 310. The lower semiconductor patterns LSP may be formed using a selective epitaxial growth (SEG) process. An inner sidewall of the second substrate 200 exposed by the through hole 310 may be used as a seed layer for the epitaxial growth of the lower semiconductor patterns LSP. The lower semiconductor pattern LSP may have a pillar structure penetrating the second substrate 200. The lower semiconductor pattern LSP may have a bottom surface in contact with the first interlayered insulating layer 118. The lower semiconductor pattern LSP may cover a sidewall of at least one of the sacrificial layers 207. For example, a top surface of the lower semiconductor pattern LSP may be located at a level between the sacrificial layers 207 vertically adjacent to each other.

The lower semiconductor pattern LSP may include a portion having a single- or poly-crystalline structure. The lower semiconductor pattern LSP may include, for example, a silicon layer, but the inventive concept need not be limited thereto. For example, at least one of carbon nano structures, organic semiconductor materials, and compound semiconductors may be used as the lower semiconductor pattern LSP.

The lower semiconductor pattern LSP may be formed to have the same conductivity type as the second substrate 200. In certain embodiments, the lower semiconductor pattern LSP may be doped in the SEG process, using an in-situ doping process. Alternatively, after the formation of the lower semiconductor pattern LSP, impurities may be injected into the lower semiconductor pattern LSP.

Figure 9:
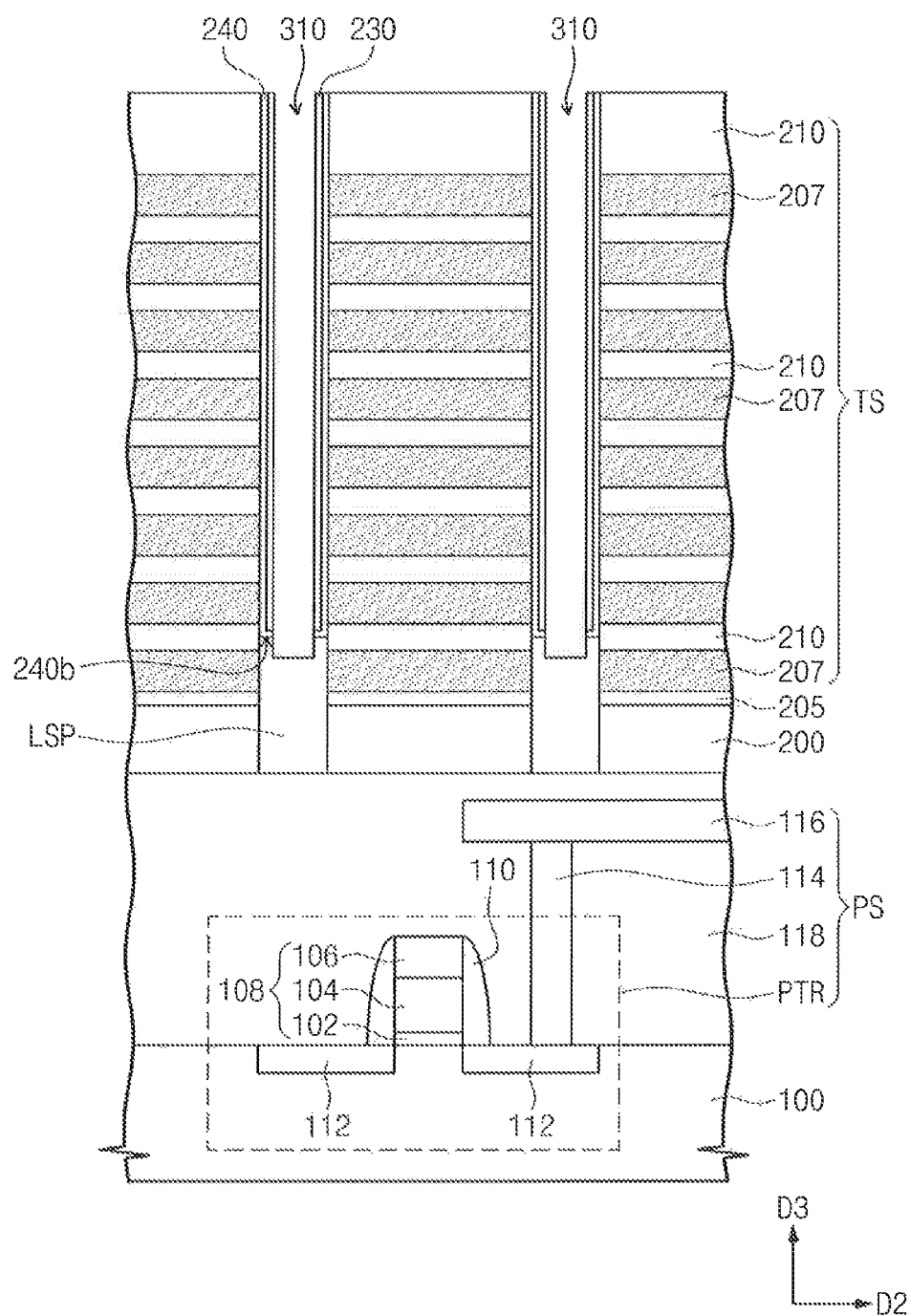

Referring to FIG. 9, a vertical insulator 240 and a first semiconductor pattern 230 may be formed on the inner surface of the through hole 310. The lower semiconductor pattern LSP may be partially recessed in forming the vertical insulator 240 and the first semiconductor pattern 230.

For example, a vertical insulating layer and a first semiconductor layer may be sequentially formed on the lower semiconductor pattern LSP in the through hole 310. The vertical insulating layer and the first semiconductor layer may have thicknesses not enough to completely fill the through hole 310. A sum of thicknesses of the vertical insulating layer and the first semiconductor layer may be smaller than half a width of the through hole 310. For example, the through hole 310 need not be filled with the vertical insulating layer and the first semiconductor layer. In addition, the vertical insulating layer may be disposed on the top surface of the lower semiconductor pattern LSP exposed by the through hole 310. The vertical insulating layer may include multi-layered thin films which may be deposited using, for example, a plasma-enhanced chemical vapor deposition (PE-CVD) process, a physical vapor deposition (PVD) process, or an atomic layer deposition (ALD) process.

The vertical insulating layer may include a charge storing layer, which may serve as a memory element of FLASH memory devices. For example, the charge storing layer may be a trap insulating layer or an insulating layer including conductive nanodots. Alternatively, the vertical insulating layer may include a phase-changeable element or a variable resistance element.

Referring to FIG. 4, the vertical insulating layer may include a blocking insulating layer BL, a charge storing layer CL, and a tunnel insulating layer TL, which may be sequentially stacked on the side surface of the through hole 310. The blocking insulating layer BL may be formed on the sidewalk of the sacrificial layers 207 and the insulating layers 210 and the top surface of the lower semiconductor pattern LSP exposed by the through hole 310. The blocking insulating layer BL may be formed of for example, a silicon oxide layer, a hafnium oxide layer, or an aluminum oxide layer. The charge storing layer CL may include a trap insulating layer or an insulating layer with conductive nano dots. The charge storing layer CL may include at least one of a silicon nitride layer, a silicon oxynitride layer, a silicon-rich nitride layer, a nano-crystalline silicon layer, and a laminated trap layer. The tunnel insulating layer TL may be one of materials, whose band gaps are larger than that of the charge storing layer CL. For example, the tunnel insulating layer IL may be a silicon oxide layer.

The first semiconductor layer may be formed on the vertical insulating layer. The first semiconductor layer may be a semiconductor material (e.g., a poly-crystalline silicon layer, a single-crystalline silicon layer, or an amorphous silicon layer), which may be formed by one of ALD or CND processes.

The first semiconductor layer and the vertical insulating layer may be anisotropically etched to expose the top surface of the lower semiconductor pattern LSP. Accordingly, the first semiconductor pattern 230 and the vertical insulator 240 may be formed on the inner surface of the through hole 310. For example, the vertical insulator 240 and the first semiconductor pattern 230 may be formed to have a cylindrical structure with open top and bottom ends. In certain embodiments, the anisotropic etching of the first semiconductor layer and the vertical insulating layer may be performed in an over-etch manner, and in this case, the lower semiconductor pattern LSP exposed by the first semiconductor pattern 230 and the vertical insulator 240 may have a recessed top surface.

During the anisotropic etching process, a portion of the vertical insulating layer positioned under the first semiconductor pattern 230 need not be etched. In this case, the vertical insulator 240 may include a bottom portion interposed between the first semiconductor pattern 230 and the lower semiconductor pattern LSP, when viewed in a sectional view. Accordingly, a bottom surface 240b of the vertical insulator 240 may be in contact with at least a portion of the top surface of the lower semiconductor pattern LSP.

Furthermore, after the anisotropic etching process of the first semiconductor layer and the vertical insulating layer, the top surface of the layered structure TS may be exposed.

Accordingly, the vertical insulator 240 and the first semiconductor pattern 230 may be localized within each of the through holes 310, which may be two-dimensionally arranged on the second substrate 200.

Figure 10:
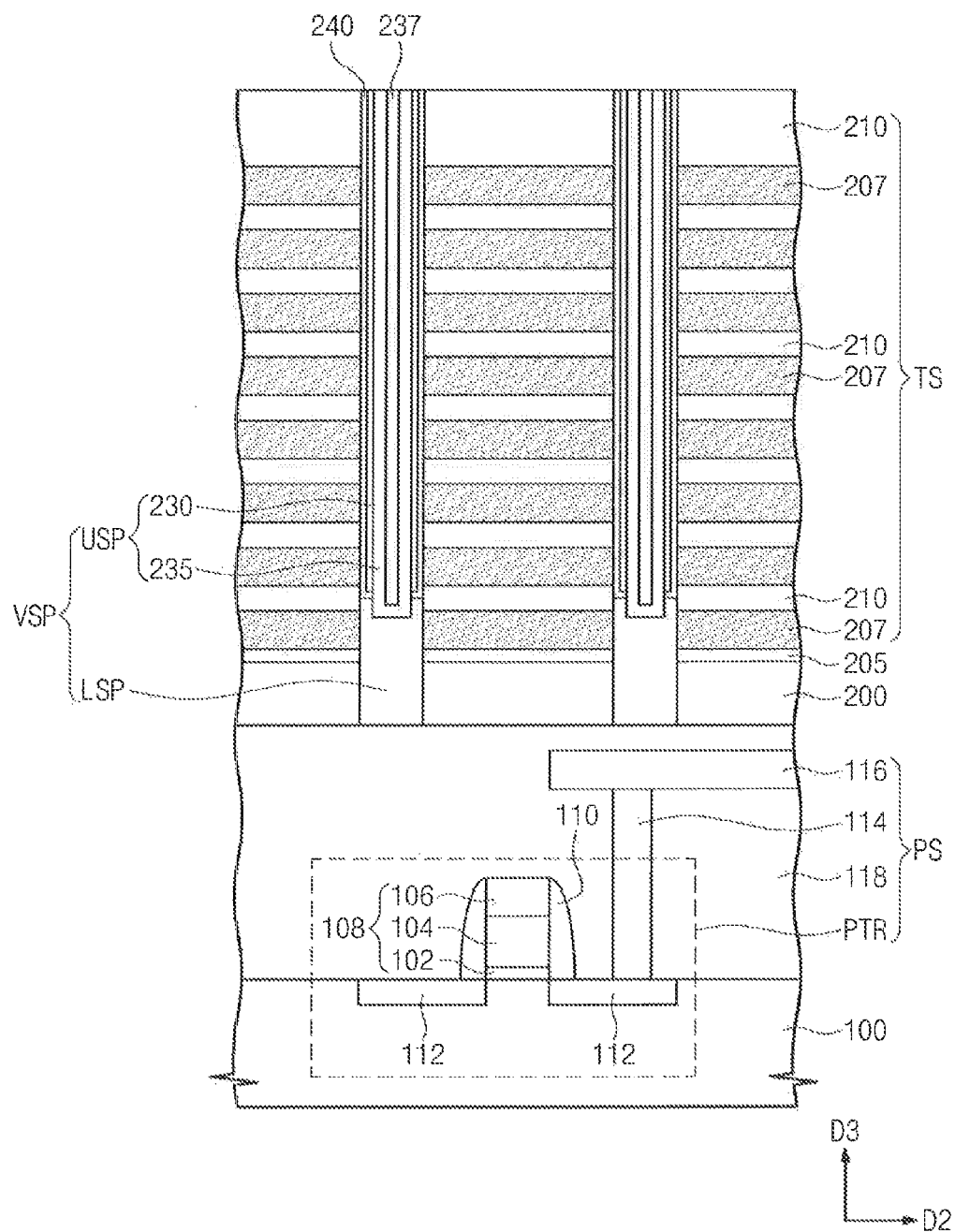

Referring to FIG. 10, a second semiconductor pattern 235 and an insulating gapfill pattern 237 may be formed on the resulting structure FIG. 9.

For example, a second semiconductor layer and an insulating gapfill layer may be sequentially formed on the vertical insulator 240 and the first semiconductor pattern 230 in the through hole 310. The second semiconductor layer may be conformally formed in the through hole 310, and the second semiconductor layer may have a thickness not enough to completely fill the through hole 310. The second semiconductor layer may connect the lower semiconductor pattern LSP to the first semiconductor pattern 230. The second semiconductor layer may be a semiconductor material (e.g., a poly-crystalline silicon layer, a single-crystalline silicon layer, or an amorphous silicon layer), which may be formed by one of ALD or CVD processes. The insulating gapfill layer may be formed to completely fill the through hole 310 by filling a space defined in the second semiconductor layer. The insulating gapfill layer may be one of a spin-on-glass (SOG) insulating layer and a silicon oxide layer. Thereafter, the second semiconductor layer and the insulating gapfill layer may be planarized to expose the top surface of the layered structure TS, and thus, the second semiconductor pattern 235 and the insulating gapfill pattern 237 may be localized within the through hole 310.

The second semiconductor pattern 235 may be formed to have a pipe-shaped or hollow-cylindrical structure with a closed one end portion (e.g., shaped like a cup). Alternatively, the second semiconductor pattern 235 may be formed to fill the through hole 310 or have a solid pillar structure.

The insulating gapfill pattern 237 may be formed to fill the through hole 310 disposed with the second semiconductor pattern 235.

The first and second semiconductor patterns 230 and 235 may constitute an upper semiconductor pattern USP. The upper semiconductor pattern USP may be formed on the lower semiconductor pattern LSP. The upper semiconductor pattern USP and the lower semiconductor pattern LSP may constitute a vertical semiconductor pattern \TSP.

Figure 11:
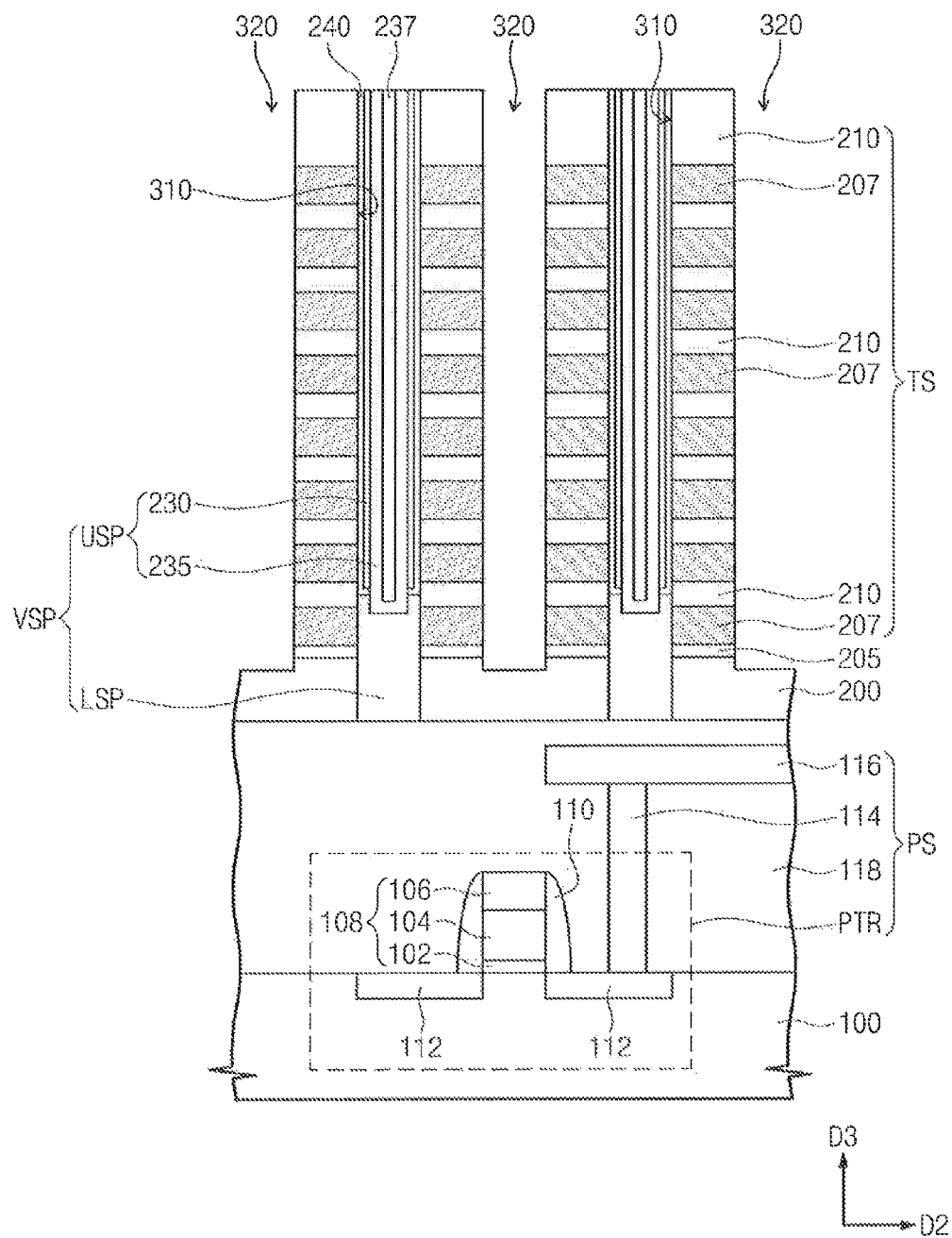

Referring to FIG. 11, the layered structure TS may be patterned to form trenches 320 exposing the second substrate 200 between the through holes 310 adjacent to each other.

For example, the formation of the trenches 320 may include forming second mask patterns (not shown) on the layered structure TS to define positions of the trenches 320 to be formed, and then, anisotropically etching the layered structure TS using the second mask patterns as an etch mask.

The trenches 320 may be spaced apart from the upper and lower semiconductor patterns USP and LSP to expose sidewalls of the sacrificial layers 207 and the insulating layers 210. When viewed in a plan view, each of the trenches 320 may be shaped like a line or rectangle, and when viewed in a vertical sectional view, the trenches 320 may expose the top surface of the second substrate 200. During the etching process, the second substrate 200 may be over-etched to have a recessed top surface. A width of the trench 320 may vary depending on a distance from the second substrate 200. For example, a bottom width of the trench 320 may be smaller than a top width thereof.

Due to the presence of the trenches 320, the layered structure TS may have elongated line-shaped portions. The vertical semiconductor patterns VSP may be located in the line-shaped portions of the layered structure TS. In addition, the vertical semiconductor patterns VSP may penetrate the second substrate 200 and may be in contact with the first interlayered insulating layer 118.

Figure 12:
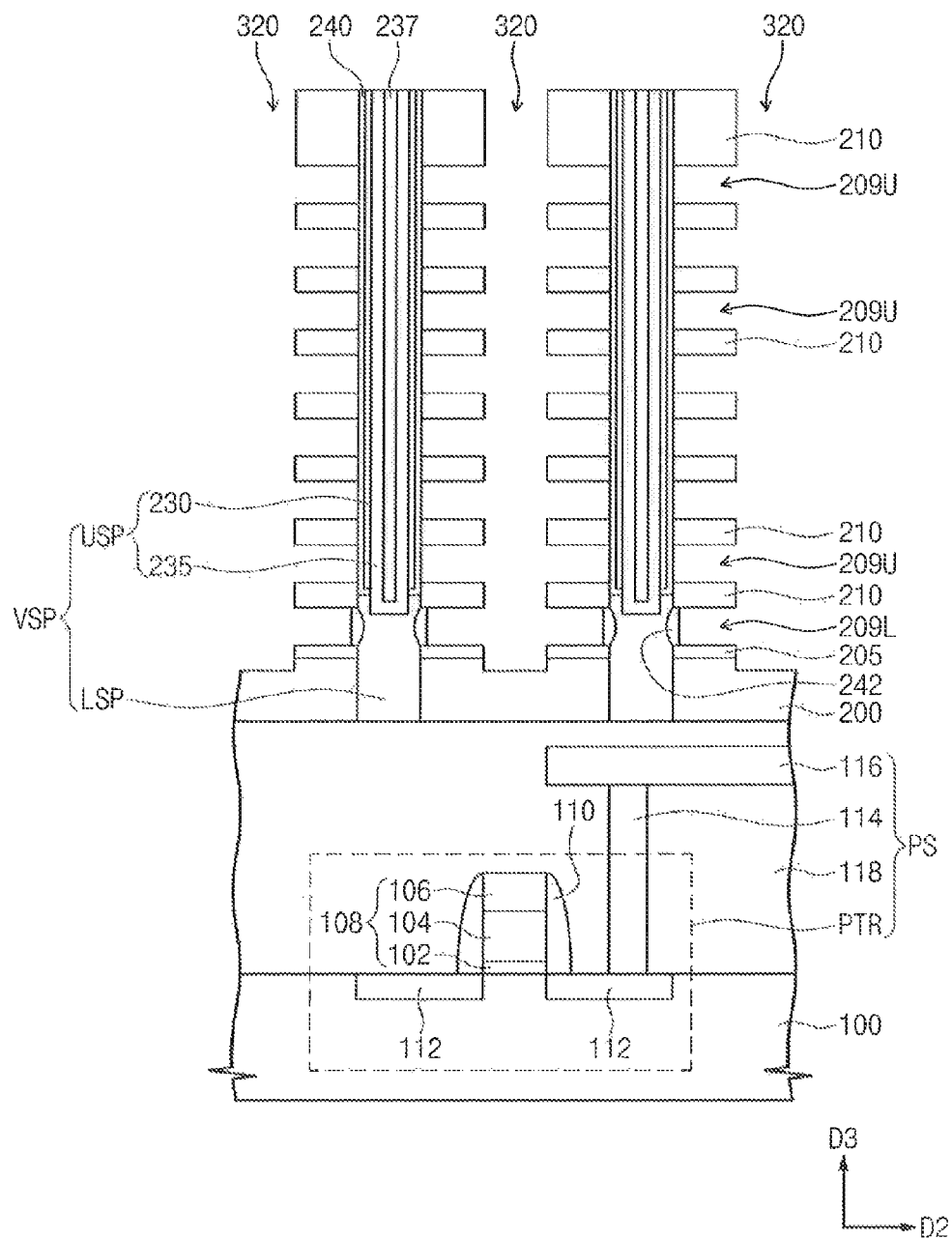

Referring to FIG. 12, the sacrificial layers 207 exposed by the trenches 320 may be removed to form lower and upper recess regions 209L and 209U between the insulating layers 210.

For example, the lower and upper recess regions 209L and 209U may be formed by removing the sacrificial layers 207 using an isotropic etching process. The isotropic etching process may be performed using an etching recipe having etch selectivity with respect to the insulating layers 210, the vertical insulator 240, the lower semiconductor pattern LSP, the lowermost insulating layer 205, and the second substrate 200. For example, in the case where the sacrificial layers 207 are formed of a silicon nitride layer and the insulating layers 210 are formed of a silicon oxide layer, the etching process may be performed using an etching solution containing phosphoric acid.

The lower recess region 209L may be horizontally extended from the trenches 320 to a region disposed between the insulating layers 210 and the lowermost insulating layer 205. The lower recess region 209L may expose a portion of the sidewall of the lower semiconductor pattern LSP. The upper recess regions 209U may be horizontally extended from the trenches 320 to regions between the insulating layers 210. The upper recess region. 209L may expose portions of the sidewalk of the vertical insulator 240. For example, the lower recess region 209L may be delimited by the insulating layers 210 and 205 vertically adjacent to each other and the sidewall of the lower semiconductor pattern LSP, while the upper recess regions 209L may be delimited by the insulating layers 210 vertically adjacent to each other and the sidewall of the vertical insulator 240.

Each of the lower and upper recess regions 209L and 209U may have substantially the same vertical thickness as a thickness of a corresponding one of the sacrificial layers 207. The lower recess region 209L may have a vertical thickness larger than those of the upper recess regions 209U. Alternatively, the lower and upper recess regions 209L and 209U may have substantially the same vertical thickness as each other.

After the formation of the recess regions 209U and 209L, a gate dielectric pattern 242 may be formed in the lower recess region 209L. The formation of the gate dielectric pattern 242 may include performing a thermal oxidation process to oxidize a portion of the sidewall of the lower semiconductor pattern LSP exposed by the lower recess region 209L. As the result of the oxidation process, the sidewall of the lower semiconductor pattern LSP exposed by the lower recess region 209L may be partially consumed. The gate dielectric pattern 242 may include, for example, a silicon oxide layer.

Figure 13:
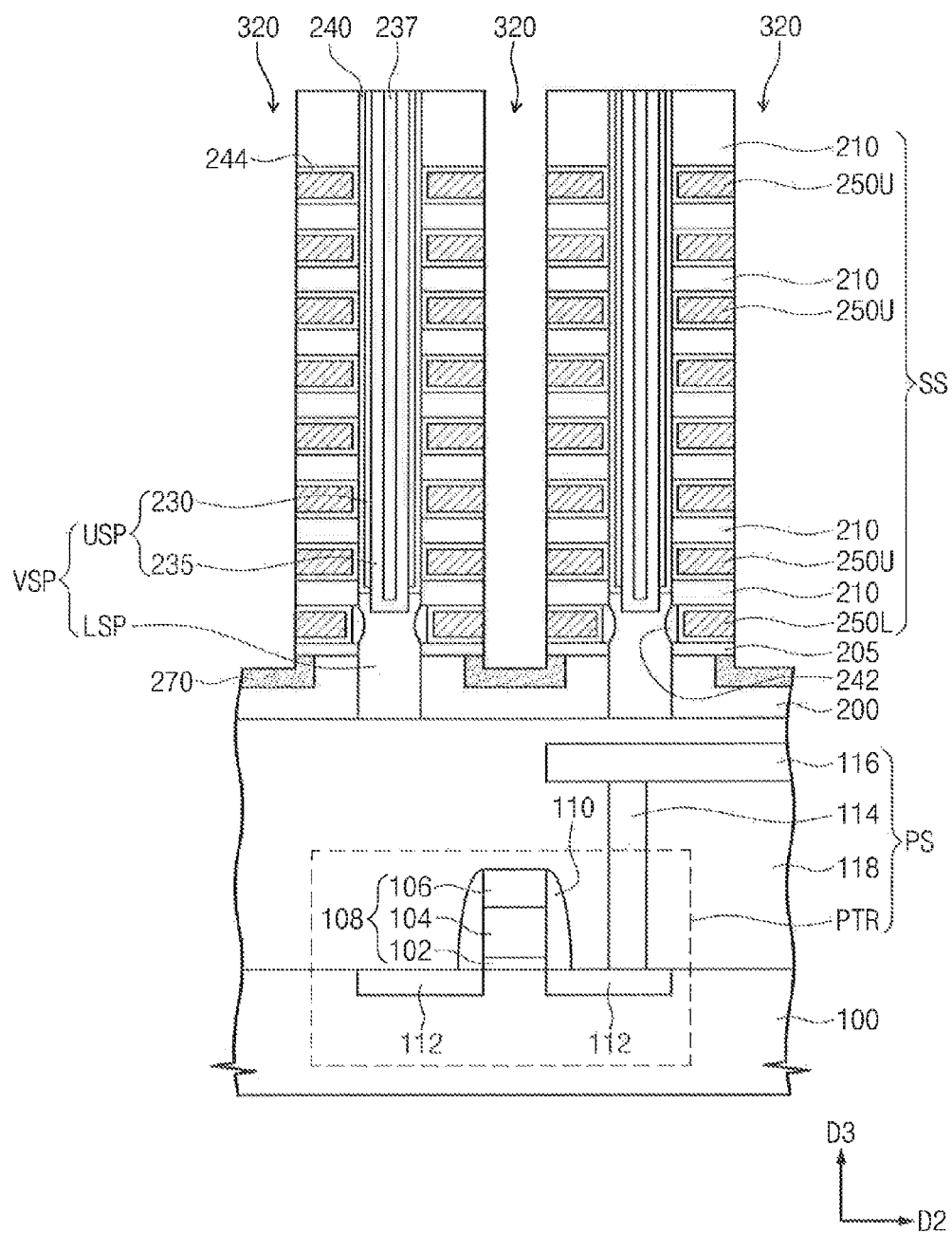

Referring to FIG. 13, horizontal insulators 244 may be formed. The horizontal insulators 244 may cover inner surfaces of the lower and upper recess regions 209L and 209U. Lowermost and upper gate electrodes 250L and 250U may fill the lower and upper recess regions 209L and 209U formed with the horizontal insulators 244.

The formation of the horizontal insulators 244 and the lowermost and upper gate electrodes 250L and 250U may include sequentially forming a horizontal insulating layer and a conductive layer in the lower and upper recess regions 209L and 209U, and then, removing the horizontal insulating layer and the conductive layer from the trenches 320 to form the horizontal insulators 244 and the lower and upper gate electrodes 250L and 250U localized within the lower and upper recess regions 209L and 209U.

Similar to the vertical insulating layer, the horizontal insulating layer may be constituted with a single-layered thin film or multi-layered thin films. The horizontal insulating layer may include a blocking insulating layer constituting a memory cell transistor of a charge-trap FLASH memory device. Referring back to FIG. 4, the blocking insulating layer may be one of materials whose band gaps are smaller than that of the tunnel insulating layer TL and larger than that of the charge storing layer CL. For example, the blocking insulating layer may be high-k dielectrics (e.g., aluminum oxide and hafnium oxide).

The conductive layer may be formed to fill the lower and upper recess regions 209L and 209U disposed with the horizontal insulating layer and may conformally cover the inner surfaces of the trenches 320. In this case, the formation of the lowermost and upper gate electrodes 250L and 250U may include removing portions of the conductive layer in the trenches 320 using an isotropic etching process. Alternatively, the conductive layer may be formed to fill the trenches 320, and in this case, the lowermost and upper gate electrodes 250L and 250U may be formed by performing an anisotropic etching process to the conductive layer disposed in the trenches 320. The upper gate electrodes 250U may be formed in the upper recess regions 209U, respectively, and the lowermost gate electrode 250L may be formed in the lower recess region 209L. The formation of the conductive layer may include sequentially depositing a barrier metal layer and a metal layer. The barrier metal layer may include or be formed of, for example, a metal nitride layer (e.g., TiN, TaN, or WN), and the metal layer may include or be formed of, for example, a metallic material (e.g., W, Al, Ti, Ta, Co, or Cu).

In the upper recess regions 209U, the horizontal insulators 244 may be in direct contact with the vertical insulator 240, and in the lower recess region 209L, the horizontal insulators 244 may be in direct contact with the gate dielectric pattern 242 on the lower semiconductor pattern LSP.

After the formation of the lowermost and upper gate electrodes 250L and 250U, common source regions 270 may be formed in the second substrate 200. The common source regions 270 may be formed by performing an ion implantation process to the second substrate 200 exposed by the trenches 320. The common source regions 270 may have a different conductivity type from the lower semiconductor pattern LSP. Alternatively, a portion of the second substrate 200 in contact with the lower semiconductor pattern LSP may have the same conductivity type as the lower semiconductor pattern LSP. In a FLASH memory device according to an exemplary embodiment of the inventive concept, the common source regions 270 may be connected to each other to be in an equipotential state. Alternatively, the common source regions 270 may be electrically separated from each other to be in electric potentials different from each other. Alternatively, the common source regions 270 may constitute source groups. The source groups may be electrically separated from each other, and each of the source groups may include common source regions 270 connected to each other, and may be equipotential.

Referring back to FIG. 3, electrode separation patterns 265 may be formed on the common source regions 270 to fill the trenches 320. The electrode separation patterns 265 may be formed of at least one of a silicon oxide layer, a silicon nitride layer, and a silicon oxynitride layer.

In addition, a conductive pad 260 may be formed to be connected to the first and second semiconductor patterns 230 and 235. The conductive pad 260 may be formed by recessing upper portions of the first and second semiconductor patterns 230 and 235 and then filling the recessed regions with a conductive material. Alternatively, the conductive pad 260 may be formed by doping the first and second semiconductor patterns 230 and 235 with impurities, and thus, the conductive pad 260 may have a different conductivity type from that of the first and second semiconductor patterns 230 and 235. In this case, the conductive pad 260 may constitute a diode in conjunction with portions of the first and second semiconductor patterns 230 and 235 disposed thereunder.

The insulating layers 210 and the gate electrodes 250L and 250U, which are alternately and repeatedly stacked on the second substrate 200, may constitute a stacked structure SS. The stacked structure SS on the second substrate 200, the vertical semiconductor pattern VSP penetrating the stacked structure SS and the second substrate 200, the vertical insulator 240 and the gate dielectric pattern 242 between the vertical semiconductor pattern VSP and the stacked structure SS, the horizontal insulators 244 between the gate electrodes 250L and 250U and the insulating layers 210, the conductive pad 260, and the electrode separation patterns 265 may constitute a cell array structure CS.

Thereafter, on the cell array structure CS, a contact plug 280 may be formed to be connected to the conductive pad 260, and a hit line 290 may be formed to be connected to the contact plug 280. The bit line 290 may be electrically connected to the first and second semiconductor patterns 230 and 235 via the contact plug 280. The bit line 290 may be formed to cross the lowermost and upper gate patterns 250L and 250U or the trenches 320. The bit line 290 may be spaced apart from the cell array structure CS by a second interlayered insulating layer 285.

Figure 14:
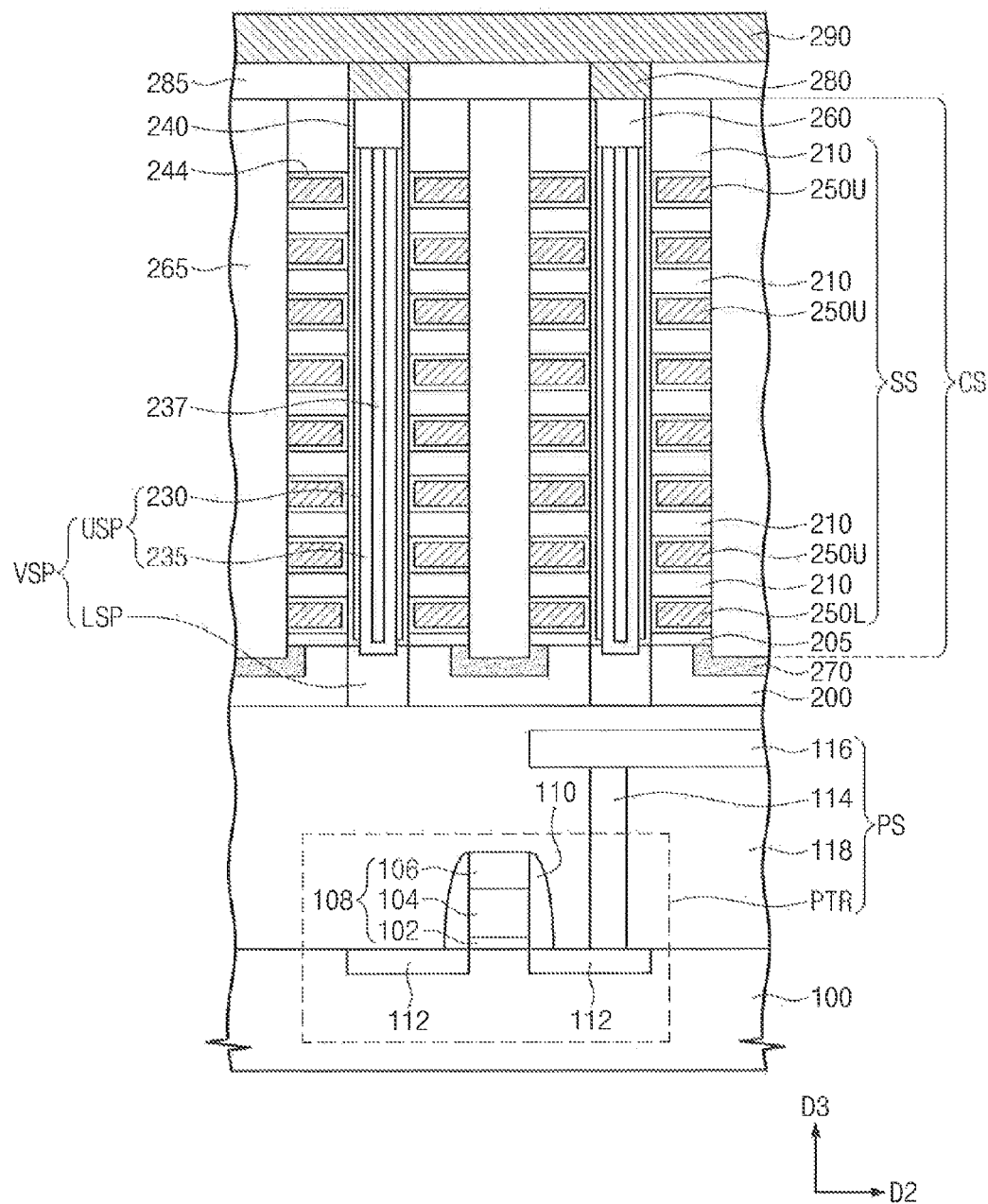
FIG. 14 is a sectional view taken along line I-I' of FIG. 2 to illustrate a 3D semiconductor memory device according to an exemplary embodiment of the inventive concept.

FIG. 14 is a sectional view taken along a line I-I' of FIG. 2 to illustrate a 3D semiconductor memory device according to an exemplary embodiment of the inventive concept.

Referring to FIG. 14, a 3D semiconductor memory device may include the peripheral circuit structure PS disposed on the first substrate 100, the cell array structure CS disposed on the peripheral circuit structure PS, and the second substrate 200 disposed between the peripheral circuit structure PS and the cell array structure CS.

The cell array structure CS may include the stacked structure SS including insulating layers 210 and the gate electrodes, which are alternately and repeatedly stacked on the second substrate 200. The gate electrodes may include the lowermost gate electrode 250L on the second substrate 200 and the upper gate electrodes 250U stacked on the lowermost gate electrode 250L.

The cell array structure CS may further include the vertical semiconductor patterns VSP, which may penetrate the stacked structure SS and be electrically connected to the second substrate 200. Each of the vertical semiconductor patterns VSP may penetrate the stacked structure SS and the second substrate 200 and be in contact with the top surface of the peripheral circuit structure PS.

Each of the vertical semiconductor patterns VSP may include the lower semiconductor pattern LSP penetrating the second substrate 200 to be in contact with the top surface of the peripheral circuit structure PS and the upper semiconductor pattern USP penetrating the stacked structure SS to be connected to the lower semiconductor pattern LSP. For example, the lower semiconductor pattern LSP may be locally disposed in the second substrate 200.

The lower semiconductor pattern LSP may be epitaxially grown from the inner sidewall of the second substrate 200 formed of a semiconductor material. The second substrate 200 may serve as a seed layer. The lower semiconductor pattern LSP may be in contact with the inner sidewall of the second substrate 200, and the bottom surface of the lower semiconductor pattern LSP may be in contact with the peripheral circuit structure PS. The top surface of the lower semiconductor pattern LSP may be substantially coplanar with the top surface of the second substrate 200.

Since the lower semiconductor pattern LSP is locally disposed within the second substrate 200, the vertical insulator 240 may be interposed between the upper semiconductor pattern USP and the lowermost gate electrode 250L.

Figure 15:
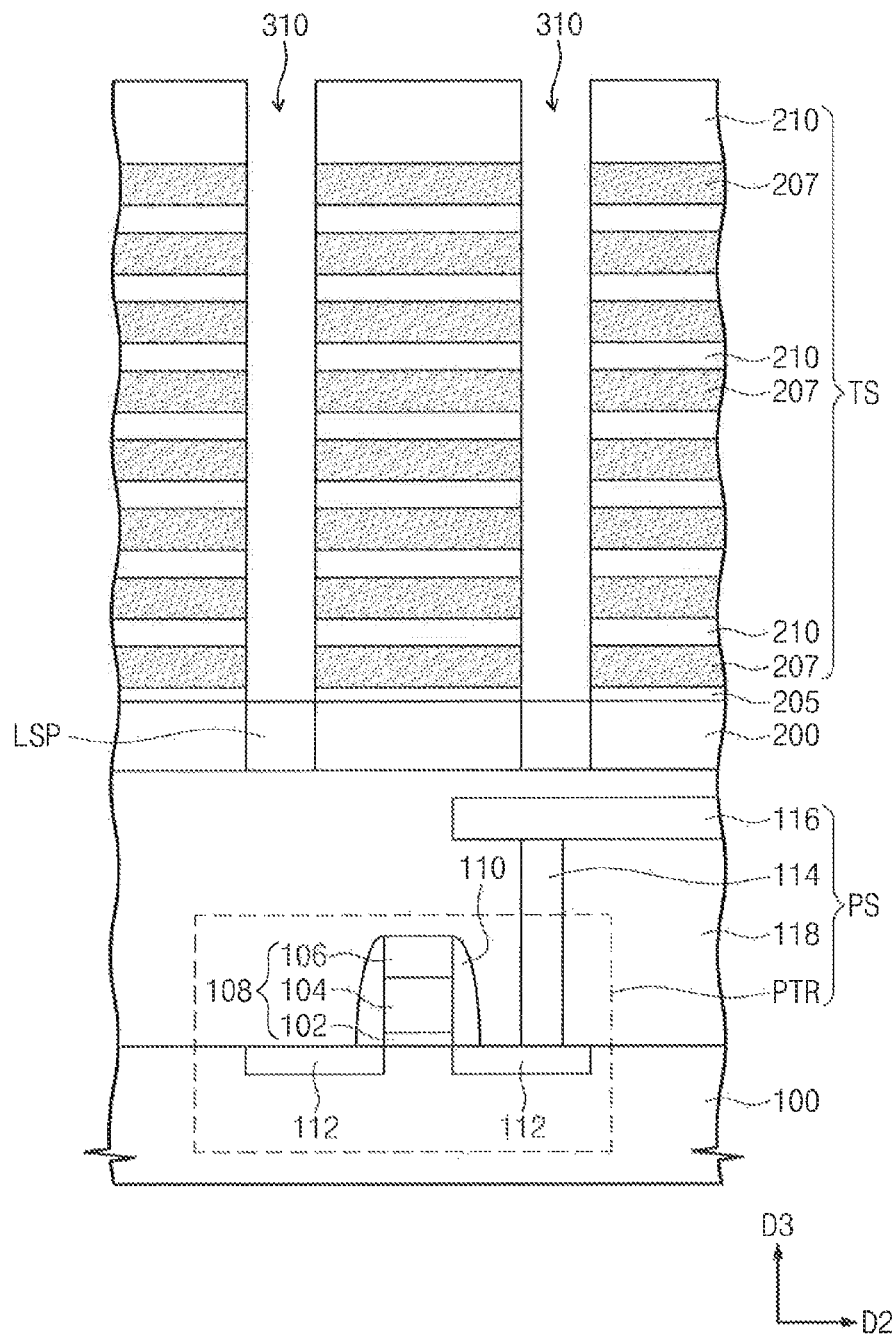
FIGS. 15 through 17 are sectional views taken along line I-I' of FIG. 2 to illustrate a method of fabricating a 3D semiconductor memory device according to an exemplary embodiment of the inventive concept.
Figure 16:
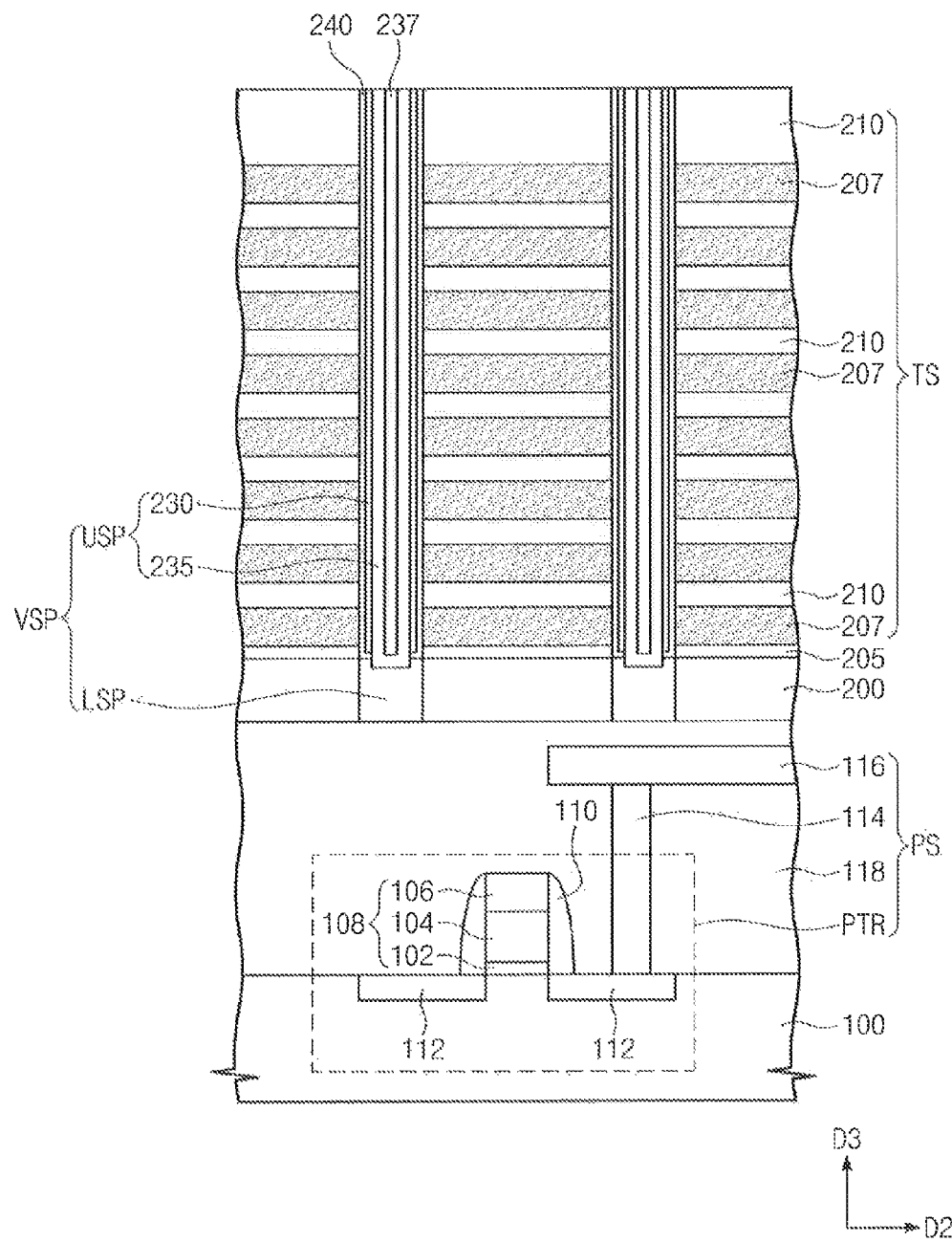
Figure 17:
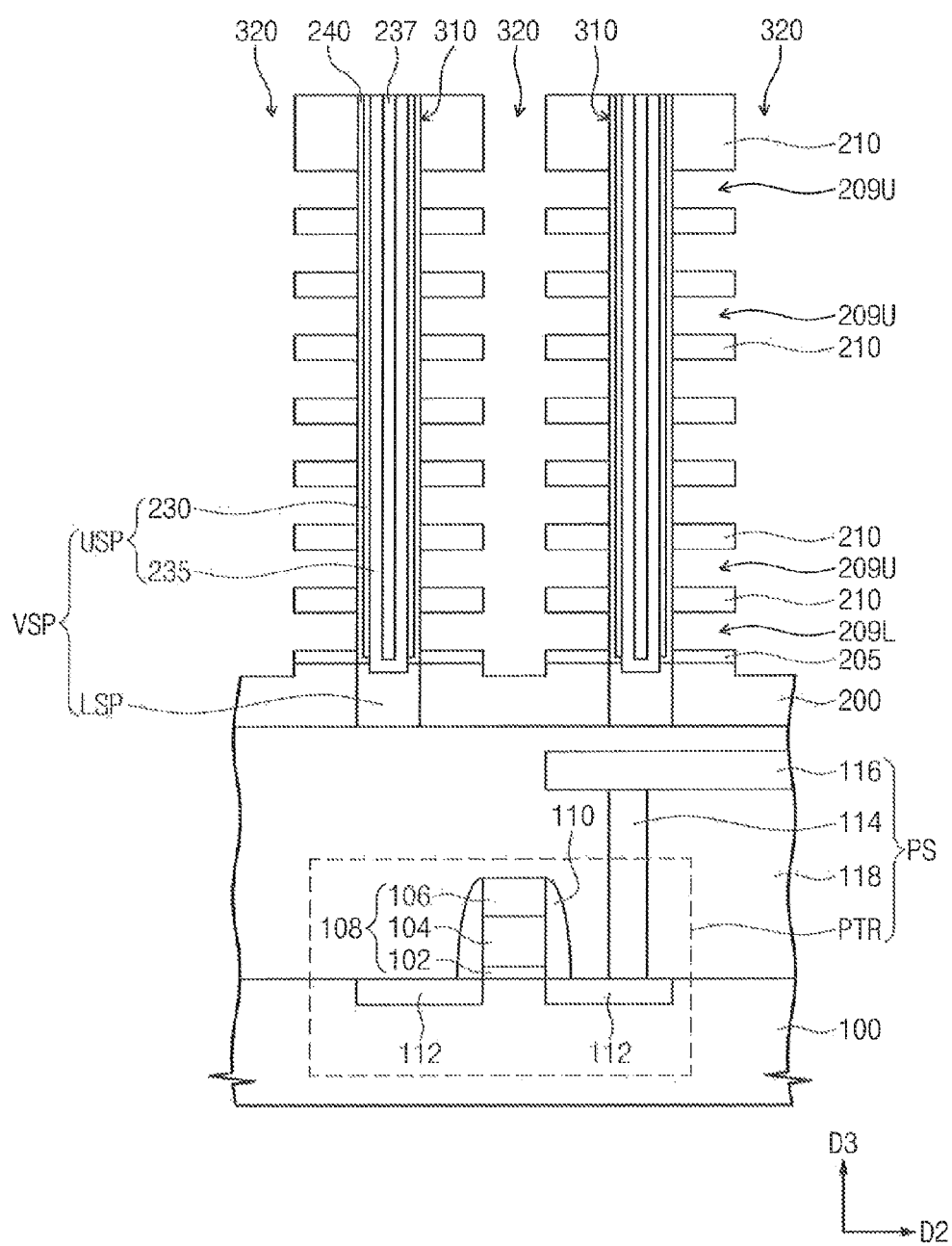

FIGS. 15 through 17 are sectional views taken along line I-I of FIG. 2 to illustrate a method of fabricating a 3D semiconductor memory device according to an exemplary embodiment of the inventive concept.

As described with reference to FIGS. 5 through 7, the peripheral circuit structure PS may be formed on the first substrate 100, and the second substrate 200 may be formed on the peripheral circuit structure PS. The sacrificial layers 207 and the insulating layers 210 may be alternately and repeatedly stacked on the second substrate 200 to form the layered structure TS, and the through holes 310 may be formed to penetrate the layered structure TS and the second substrate 200 and expose the top surface of the peripheral circuit structure PS.

Referring to FIG. 15, the lower semiconductor patterns LSP may be formed. The lower semiconductor patterns LSP may fill the lower regions of the through holes 310. The lower semiconductor patterns LSP may be formed using a selective epitaxial growth (SEG) process. The inner sidewall of the second substrate 200 exposed by the through hole 310 may be used as a seed layer. The lower semiconductor pattern LSP may be formed to have a pillar structure penetrating the second substrate 200. The top surface of the lower semiconductor pattern LSP may be substantially coplanar with the top surface of the second substrate 200. For example, the lower semiconductor pattern LSP may be locally formed in the second substrate 200.

Referring to FIG. 16, the vertical insulator 240 and the first semiconductor pattern 230 may be formed on the lower semiconductor patter LSP to cover the inner sidewall of the through hole 310. The second semiconductor pattern 235 and the insulating gapfill pattern 237 may be formed on the vertical insulator 240 and the first semiconductor pattern 230. The first and second semiconductor patterns 230 and 235 may constitute the upper semiconductor pattern USP. The upper semiconductor pattern USP may be formed on the lower semiconductor pattern LSP. The first semiconductor pattern 230 may be spaced apart from the lower semiconductor pattern LSP, and the second semiconductor pattern 235 may be formed to connect the first semiconductor pattern 230 to the lower semiconductor pattern LSP. The upper semiconductor pattern USP and the lower semiconductor pattern LSP may constitute the vertical semiconductor pattern VSP. The vertical insulator 240, the upper semiconductor pattern LISP, and the insulating gapfill pattern 237 may be formed using substantially the same process as that in the previous embodiments described with reference to FIGS. 9 and 10.

Referring to FIG. 17, the layered structure TS may be patterned to form the trenches 320 exposing the second substrate 200 between the through holes 310 adjacent to each other. The trenches 320 may be spaced apart from the upper and lower semiconductor patterns USP and LSP to expose the sidewalls of the sacrificial layers 207 and the insulating layers 210. The sacrificial layers 207 exposed by the trenches 320 may be removed to form lower and upper recess regions 209L and 209U between the insulating layers 210.

The lower recess region 209L may be horizontally extended from the trenches 320 to a region between the insulating layers 210 and the lowermost insulating layer 205 to expose a portion of the sidewall of the vertical insulator 240. The upper recess regions 209U may be horizontally extended from the trenches 320 to regions between the insulating layers 210 to expose portions of the sidewalls of the vertical insulator 240. For example, the lower and upper recess regions 209L and 209U may be delimited by the insulating layers 210 and 205 vertically adjacent to each other and a sidewall of the vertical insulator 240. The formation of the gate dielectric pattern 242 in the lower recess region 209L may be omitted.

Referring back to FIG. 14, the horizontal insulators 244 may be formed to cover the inner surfaces of the lower and upper recess regions 209L and 209U, and the lowermost and upper gate electrodes 250L and 250U may be formed to fill the lower and upper recess regions 209L and 209U formed with the horizontal insulators 244. In certain embodiments, the horizontal insulators 244 may be in direct contact with the vertical insulator 240, in the lower and upper recess regions 209L and 209U.

After the formation of the lowermost and upper gate electrodes 250L and 250U, the common source regions 270 may be formed in the second substrate 200, and the electrode separation patterns 265 may be formed on the common source regions 270 to fill the trenches 320, in addition, the conductive pad 260 may be formed to be connected to the first and second semiconductor patterns 230 and 235, and the contact plug 280 may be formed to be connected to the conductive pad 260, and the bit line 290 may be formed to be connected to the contact plug 280.

According to an exemplary embodiment of the inventive concept, the lower semiconductor pattern LSP may be used as a channel region of a lower transistor controlled by the lowermost gate electrode 250L. Here, the lower semiconductor pattern LSP may be formed to penetrate the second substrate 200 and thereby to be in contact with the inner sidewall of the second substrate 200 and the peripheral circuit structure PS. For example, the lower semiconductor pattern LSP may be an epitaxial pattern grown from the inner sidewall of the second substrate 200 which may serve as a seed layer. Since the lower semiconductor pattern LSP is formed to penetrate the second substrate 200, it is possible to increase uniformity in thickness of the lower semiconductor pattern LSP or a distance between the bottom surface of the lower semiconductor pattern LSP, which is in contact with the peripheral circuit structure PS, and the top surface of the lower semiconductor pattern LSP. Accordingly, a 3D semiconductor memory device may have an increased uniformity in amount of cell current. Further, since the peripheral circuit structure PS, the second substrate 200, and the cell array structure CS are vertically and sequentially stacked, it is possible to increase an integration density of the 3D semiconductor memory device.

Figure 18:
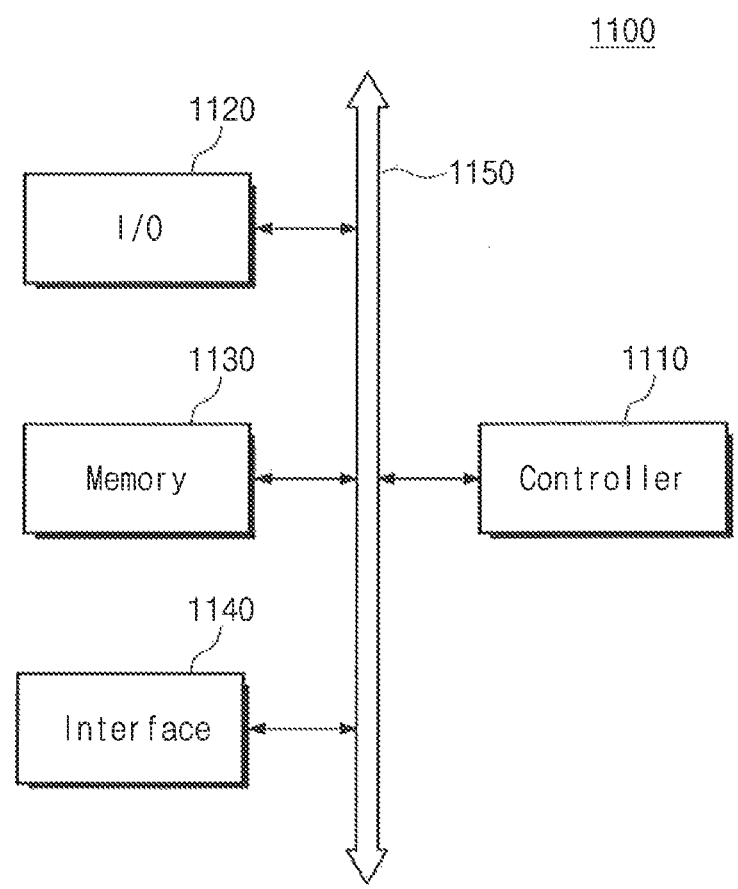
FIG. 18 is a block diagram illustrating an exemplary electronic systems including 3D semiconductor memory devices according to an exemplary embodiment of the inventive concept.

FIG. 18 is a block diagram illustrating an exemplary electronic systems including 3D semiconductor memory devices according to an exemplary embodiment of the inventive concept.

Referring to FIG. 18, an electronic system 1100 may be applied to a personal digital assistant (PDA), a portable computer, a web tablet, a wireless phone, a mobile phone, a digital music player, a memory card, or other electronic products receiving and/or transmitting information data by wireless.

The electronic system 1100 may include a controller 1110, an input/output (I/O) unit 1120 (e.g., a keypad, a keyboard, and/or a display), a memory device 1130, an interface unit 1140, and a data bus 1150. The memory device 1130 and the interface unit 1140 may communicate with each other through the data bus 1150.

The controller 1110 may include at least one of a microprocessor, a digital signal processor, a microcontroller, or other logic device having a similar function to any one thereof. The memory device 1130 may store data processed by the controller 1110. The I/O unit 1120 may receive data or signals from the outside of the electronic system 1100 or may output data or signals to the outside of the electronic system 1100.

The memory device 1130 may include at least one of 3D semiconductor memory devices according to an exemplary embodiment of the inventive concept. Additionally, the memory device 1130 may further include at least one of another kind of a memory device, a random access volatile memory device, or other various kinds of memory devices.

The interface unit 1140 may transmit electrical data to a communication network or may receive electrical data from a communication network.

The 3D semiconductor memory devices and the memory systems according to the inventive concepts may be encapsulated using various packaging techniques. For example, the 3D semiconductor memory devices and the memory systems may be encapsulated using any one of a package on package (POP) technique, a ball grid arrays BGAs technique, a chip scale packages CSPs technique, a plastic leaded chip carrier PLCC technique, a plastic dual in-line package PDIP technique., a die in waffle pack technique, a die in wafer form technique, a chip on board COB technique, a ceramic dual in-line package CERDIP technique, a plastic metric quad flat package (PMQFP) technique, a plastic quad flat package (NH) technique, a small outline package SOIC technique, a shrink small outline package SSOP technique, a thin small outline package TSOP technique, a thin quad flat package TQFP technique, a system in package SIP technique, a multi-chip package MCP technique, a wafer-level fabricated package WFP technique and a wafer-level processed stack package WSP technique.

Figure 19:
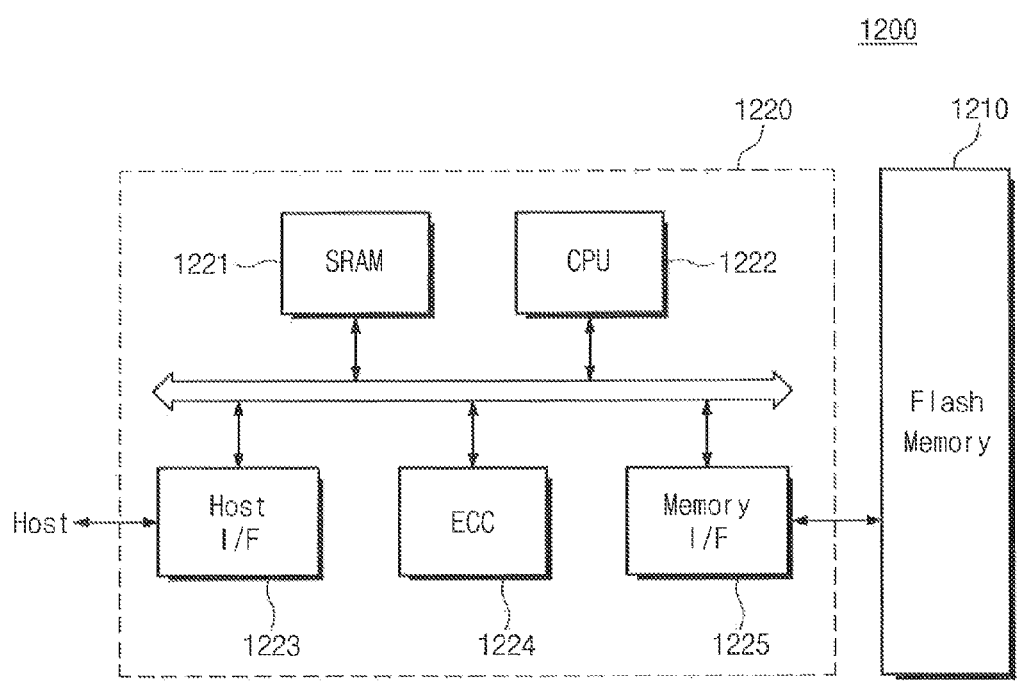
FIG. 19 is a block diagram illustrating an exemplary memory systems including 3D semiconductor memory devices according to an exemplary embodiment of the inventive concept.

FIG. 19 is a block diagram illustrating an exemplary memory system including 3D semiconductor memory devices according to an exemplary embodiment of the inventive concept.

Referring to FIG. 19, a memory system 1200 may include a non-volatile memory device 1210 in order to store massive data. The non-volatile memory device 1210 may include at least one of the 3D semiconductor memory devices according to the aforementioned embodiments of the inventive concepts. The memory system 1200 may include a memory controller 1220 that controls data communication between a host and the non-volatile memory device 1210.

A static random access memory (SRAM) device 1221 may be used as an operation memory of a central processing unit (CPU) 1222. A host interface unit 1223 may be configured to include a data communication protocol between the memory system 1200 and the host. An error check and correction (ECC) block 1224 may detect and correct errors of data which are read out from the non-volatile memory device 1210. A memory interface unit 1225 may interface with the non-volatile memory device 1210 according to the inventive concepts. The CPU 1222 may perform overall operations for data exchange of the memory controller 1220. Even though not shown in the drawings, the memory system 1200 may further include a read only memory (ROM) device that stores code data to interface with the host.

Figure 20:
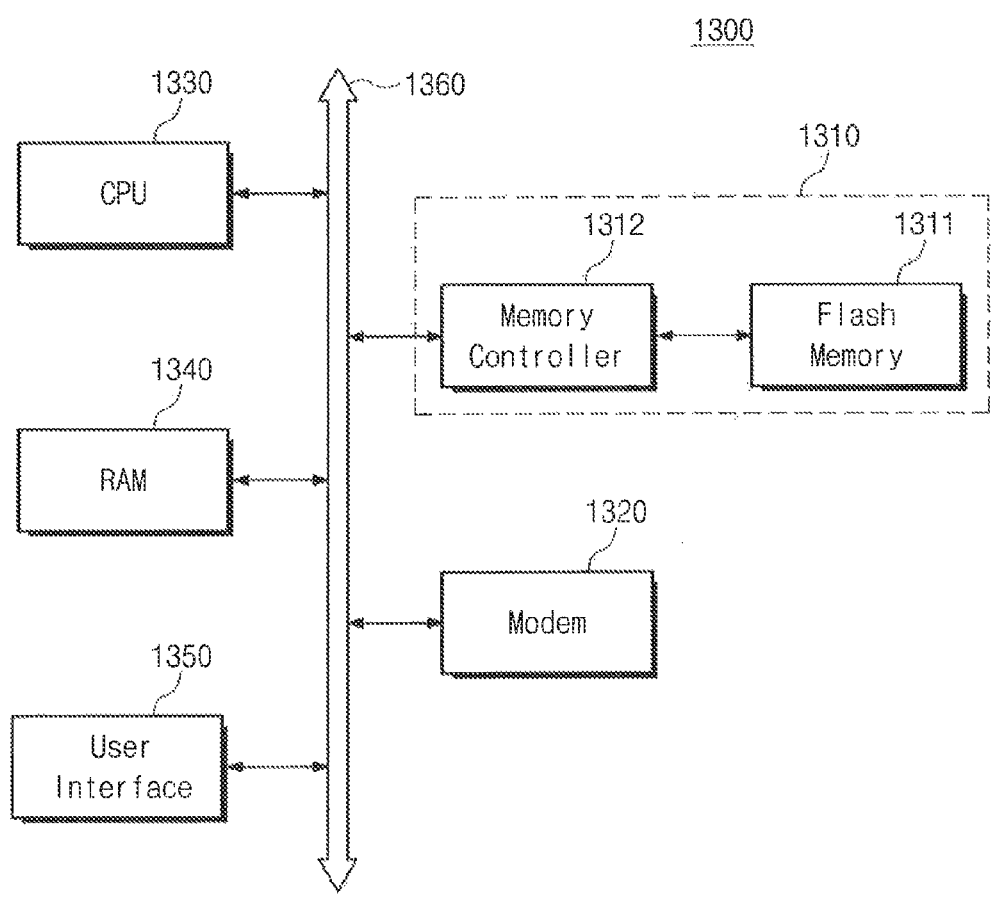
FIG. 20 is a block diagram illustrating an exemplary information processing systems including 3D semiconductor memory devices according to an exemplary embodiment of the inventive concept.

FIG. 20 is a block diagram illustrating an exemplary information processing systems including 3D semiconductor memory devices according to an exemplary embodiment of the inventive concept.

Referring to FIG. 20, a non-volatile memory system 1310 may be installed in an information processing system 1300 such as a mobile device or a desk top computer. The non-volatile memory system 1310 may include a memory controller 1312 and a non-volatile memory device 1311. The non-volatile memory device 1311 may include at least one of the 3D semiconductor memory devices according to the above embodiments of the inventive concepts. The information processing system 1300 according to the inventive concepts may include a modem 1320, a central processing unit (CPU) 1330, a random access memory (RAM) 1340 and a user interface unit 1350 that are electrically connected to the non-volatile memory system 1310 through a system bus 1360. The non-volatile memory system 1310 may be substantially the same as the aforementioned memory system or non-volatile memory system. Data processed by the CPU 1330 or data inputted from the outside may be stored in the non-volatile memory system 1310. Here, the non-volatile memory system 1310 may be realized as a solid state disk SSD device. In this case, the information processing system 1300 may stably store massive data in the non-volatile memory system 1310. Additionally, as reliability of the non-volatile memory system 1310 may increase, the non-volatile memory system 1310 may reduce a resource consumed for correcting errors. Even though not shown in the drawings, an application chipset and/or a camera image processor (CIS), an input/output unit may further be disposed in the information processing system 1300.

According to an exemplary embodiment of the inventive concept, the lower semiconductor patterns may be disposed to have a uniform thickness, and thus, the 3D semiconductor memory device can have an improved cell current property.

In addition, the cell array structure may be vertically stacked on the peripheral circuit structure, and thus, the 3D semiconductor memory device can have an increased integration density.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device, comprising:
a peripheral circuit structure disposed on a first substrate;
a cell array structure disposed on the peripheral circuit structure; and
a second substrate interposed between the peripheral circuit structure and the cell array structure,
wherein the cell array structure comprises:
a stacked structure including a plurality of gate electrodes stacked on the second substrate;
a through hole penetrating the stacked structure and at least a portion of the second substrate; and
a vertical semiconductor pattern disposed on the peripheral circuit structure and provided in the through hole.

2. The device of claim 1, wherein the vertical semiconductor pattern comprises:
a lower semiconductor pattern filling a lower region of the through hole; and
an upper semiconductor pattern disposed on the lower semiconductor pattern.

3. The device of claim 2, wherein the lower semiconductor pattern is epitaxially formed using an inner sidewall of the second substrate exposed by the through hole as a seed layer.

4. The device of claim 3, wherein the second substrate is formed of polysilicon.

5. The device of claim 2, wherein the plurality of gate electrodes comprises a lowermost gate electrode adjacent to the lower semiconductor pattern and upper gate electrodes adjacent to the upper semiconductor pattern, wherein the upper gate electrodes are stacked on the lowermost gate electrode, and
wherein the lower semiconductor pattern has a top surface higher than a top surface of the lowermost gate electrode.

6. The device of claim 5, further comprising:
a vertical insulator interposed between the upper semiconductor pattern and the upper gate electrodes; and
a gate dielectric pattern between the lower semiconductor pattern and the lowermost gate electrode,
wherein the vertical insulator and the gate dielectric pattern are formed by different processes from each other.

7. The device of claim 2, wherein the plurality of gate electrodes comprises a lowermost gate electrode and upper gate electrodes stacked on the lowermost gate electrode, wherein the lowermost gate electrode is adjacent to the upper semiconductor pattern, and
wherein a top surface of the lower semiconductor pattern is lower than a bottom surface of the lowermost gate electrode.

8. The device of claim 2, wherein the upper semiconductor pattern comprises:
a first semiconductor pattern spaced apart from the lower semiconductor pattern; and
a second semiconductor pattern disposed on an inner sidewall of the first semiconductor pattern and connected to the lower semiconductor pattern.

9. The device of claim 2, further comprising a vertical insulator interposed between the upper semiconductor pattern and the plurality of gate electrodes, wherein a bottom surface of the vertical insulator is in contact with at least a portion of a top surface of the lower semiconductor pattern.

10. The device of claim 1, wherein the peripheral circuit structure comprises a peripheral transistor on the first substrate and an interlayered insulating layer covering the peripheral transistor, and
wherein the through hole penetrates the second substrate to expose the interlayered insulating layer.

11. A method of fabricating a semiconductor device, comprising:
forming a peripheral circuit structure on a first substrate, wherein the peripheral circuit structure includes a peripheral transistor disposed on the first substrate and an interlayered insulating layer covering the peripheral transistor;
forming a second substrate on the peripheral circuit structure, wherein the second substrate is formed of polysilicon;
alternately and repeatedly stacking insulating layers and sacrificial layers on the second substrate to form a layered structure;

forming a through hole penetrating the layered structure and at least a portion of the second substrate; and forming a semiconductor pattern in a lower region of the through hole to be in contact with the second substrate.

12. The method of claim 11, wherein the forming of the through hole comprises:
   etching the layered structure using an etching process having etch selectivity with respect to the second substrate; and
   etching the second substrate using an etching process having etch selectivity with respect to the interlayered insulating layer.

13. The method of claim 11, wherein the semiconductor pattern is epitaxially formed using an inner surface of the second substrate exposed by the through hole as a seed layer.

14. The method of claim 11, further comprising:
   forming a trench spaced apart from the through hole;
   removing the sacrificial layers exposed by the trench to form a lower recess region adjacent to the semiconductor pattern; and
   forming a gate dielectric pattern on the semiconductor pattern exposed by the lower recess region by a thermal oxidation process.

15. The method of claim 14, further comprising forming a gate pattern disposed on the gate dielectric pattern, wherein the gate pattern fills the lower recess region.

16. A semiconductor device, comprising:
   a peripheral circuit structure disposed on a first substrate, wherein the peripheral circuit structure includes a transistor, wherein a gate pattern of the transistor is disposed on the first substrate and a source/drain region of the transistor is formed in the first substrate;
   a second substrate disposed on the peripheral circuit structure, wherein the second substrate includes a common source region;
   a vertical semiconductor pattern including a lower semiconductor pattern and an upper semiconductor pattern, wherein the lower semiconductor pattern penetrates the second substrate, wherein a bottom surface of the lower semiconductor pattern is in contact with the peripheral circuit structure and a sidewall of the lower semiconductor pattern is in contact with the second substrate, wherein the upper semiconductor pattern is stacked on the lower semiconductor pattern;
   a plurality of gate electrodes disposed on a sidewall of the vertical semiconductor pattern;
   an electrode separation pattern disposed on the common source region of the second substrate, wherein the plurality of gate electrodes is interposed between the electrode separation pattern and the vertical semiconductor pattern; and
   a vertical insulator interposed between a sidewall of the vertical semiconductor pattern and at least one of the plurality of gate electrodes.

17. The semiconductor device of claim 16, wherein the upper semiconductor pattern comprises:
   a first semiconductor pattern; and
   a second semiconductor pattern disposed on an inner sidewall of the first semiconductor pattern and connected to the lower semiconductor pattern,
   wherein the vertical insulator is interposed between the first semiconductor pattern and the lower semiconductor pattern so that the first semiconductor pattern is not in contact with to the lower semiconductor pattern.

18. The semiconductor device of claim 16, wherein the sidewall of the lower semiconductor pattern covers a lowermost gate electrode of the plurality of gate electrodes, and a top surface of the lower semiconductor pattern is higher than a top surface of the lowermost gate electrode.

19. The semiconductor device of claim 16, wherein a top surface of the lower semiconductor pattern is lower than a bottom surface of a lowermost gate electrode of the plurality of gate electrodes.

20. The semiconductor device of claim 18, further comprising a dielectric gate pattern interposed between the lowermost gate electrode and the lower semiconductor pattern.

* * * * *